United States Patent
Lee et al.

(10) Patent No.: US 12,369,458 B2
(45) Date of Patent: Jul. 22, 2025

(54) DISPLAY DEVICE

(71) Applicant: Samsung Display Co., Ltd., Yongin-si (KR)

(72) Inventors: Hyeonbum Lee, Hwaseong-si (KR); Chiwook An, Hwaseong-si (KR); Hyunduck Cho, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 482 days.

(21) Appl. No.: 17/748,258

(22) Filed: May 19, 2022

(65) Prior Publication Data

US 2023/0038366 A1 Feb. 9, 2023

(30) Foreign Application Priority Data

Aug. 6, 2021 (KR) .................. 10-2021-0103528

(51) Int. Cl.
  *H10K 59/122* (2023.01)
  *H10K 50/858* (2023.01)
  (Continued)

(52) U.S. Cl.
  CPC ......... *H10K 59/122* (2023.02); *H10K 50/858* (2023.02); *H10K 59/353* (2023.02); *H10K 59/40* (2023.02)

(58) Field of Classification Search
  CPC .. H10K 59/122; H10K 59/873; H10K 59/879; H10K 50/844; H10K 50/858; G02B 1/118
  See application file for complete search history.

(56) References Cited

U.S. PATENT DOCUMENTS 10,734,452 B1   8/2020  Kim et al.
11,165,045 B2  11/2021  Yun et al.
(Continued)

FOREIGN PATENT DOCUMENTS

KR    1020190041558 A    4/2019
KR    1020190143556 A   12/2019
(Continued)

OTHER PUBLICATIONS

Filmetrics. (n.d.). Refractive index of al2o3. Refractive Index of Al2O3 for Thin Film Thickness Measurement. https://www.filmetrics.com/refractive-index-database/Al2O3#:~:text=For%20a%20typical%20sample%20of,nm%20are%201.77%20and%200.*
(Continued)

*Primary Examiner* — Chad M Dicke
*Assistant Examiner* — Mario Andres Autore, Jr.
(74) *Attorney, Agent, or Firm* — CANTOR COLBURN LLP

(57) ABSTRACT

A display device includes a display panel, a first insulating layer on the display panel and having a first refractive index, and a second insulating layer on the first insulating layer and having a second refractive index. The display panel includes a pixel definition layer in which a plurality of emission openings are defined, and a plurality of light emitting elements that respectively correspond to the plurality of emission openings. The first insulating layer has a plurality of openings that correspondingly overlap the plurality of emission openings. Each of the plurality of emission openings extends in an extending direction. Each of the plurality of openings extends in a direction that intersects an extending direction of an overlapped emission opening.

21 Claims, 15 Drawing Sheets

(51) Int. Cl.
*H10K 59/35* (2023.01)
*H10K 59/40* (2023.01)

(56) References Cited

U.S. PATENT DOCUMENTS

| | | | | |
|---|---|---|---|---|
| 2018/0331326 | A1* | 11/2018 | Woo | H10K 50/865 |
| 2019/0115404 | A1 | 4/2019 | Moon et al. | |
| 2019/0165058 | A1* | 5/2019 | Managaki | H10D 86/60 |
| 2019/0165061 | A1* | 5/2019 | Jung | H10K 59/873 |
| 2019/0221778 | A1* | 7/2019 | Kim | H10K 59/352 |
| 2019/0319075 | A1* | 10/2019 | Lee | H10K 39/34 |
| 2020/0028120 | A1 | 1/2020 | Sugitani et al. | |
| 2020/0142539 | A1 | 5/2020 | Kim et al. | |
| 2020/0303466 | A1* | 9/2020 | Park | H10K 59/879 |
| 2021/0013452 | A1* | 1/2021 | Kim | H10K 59/122 |
| 2021/0066667 | A1* | 3/2021 | Yun | H10K 50/844 |
| 2022/0013587 | A1* | 1/2022 | Jo | H10K 59/38 |
| 2022/0102438 | A1* | 3/2022 | Xiao | H10K 59/353 |
| 2022/0140288 | A1* | 5/2022 | Ji | H10K 50/858 257/91 |

FOREIGN PATENT DOCUMENTS

| | | |
|---|---|---|
| KR | 1020200010700 A | 1/2020 |
| KR | 1020200052483 A | 5/2020 |
| KR | 1020200060861 A | 6/2020 |
| KR | 1020200089379 A | 7/2020 |

OTHER PUBLICATIONS

Ethoxylated O-phenylphenol acrylate. Kowa American Corporation. (n.d.). https://kowachemical.com/products/ethoxylated-o-phenylphenol-acrylate/.*

* cited by examiner

FIG. 2A
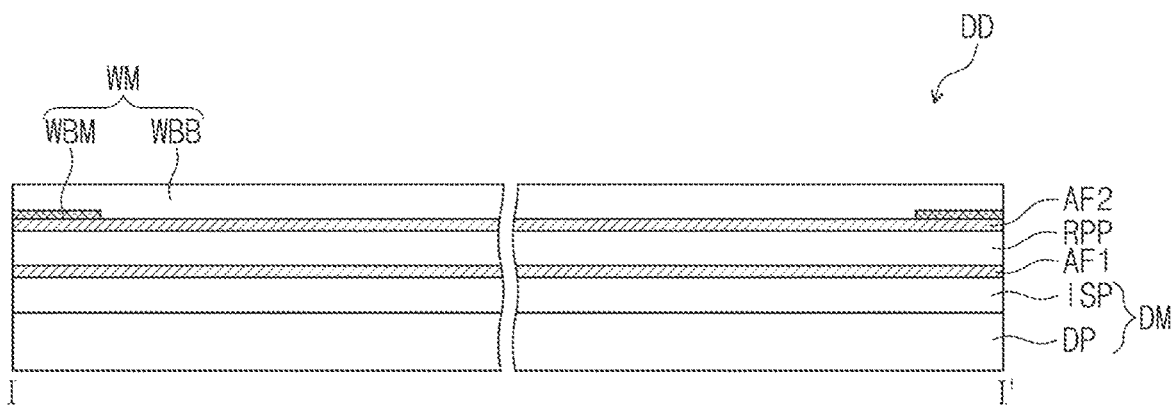
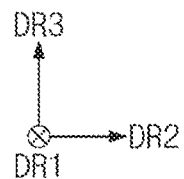
FIG. 2B
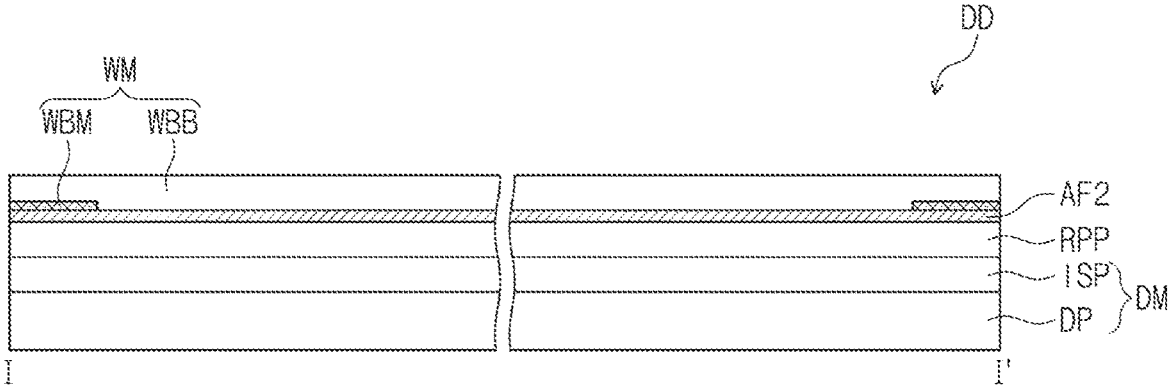
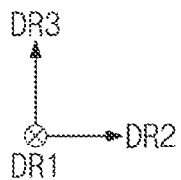

FIG. 8
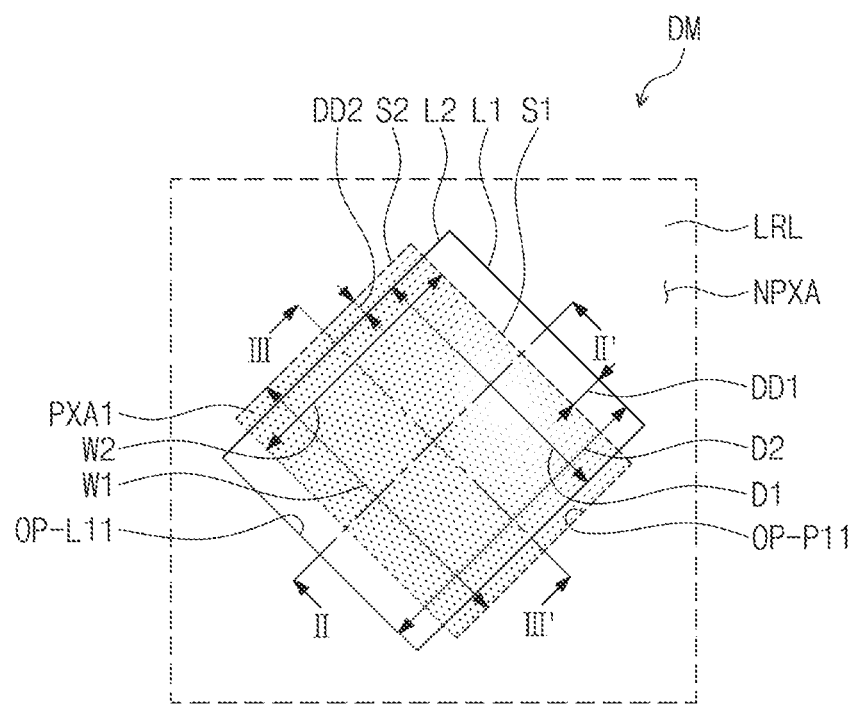
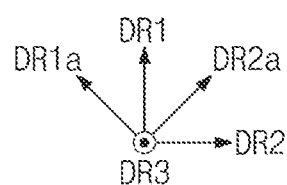

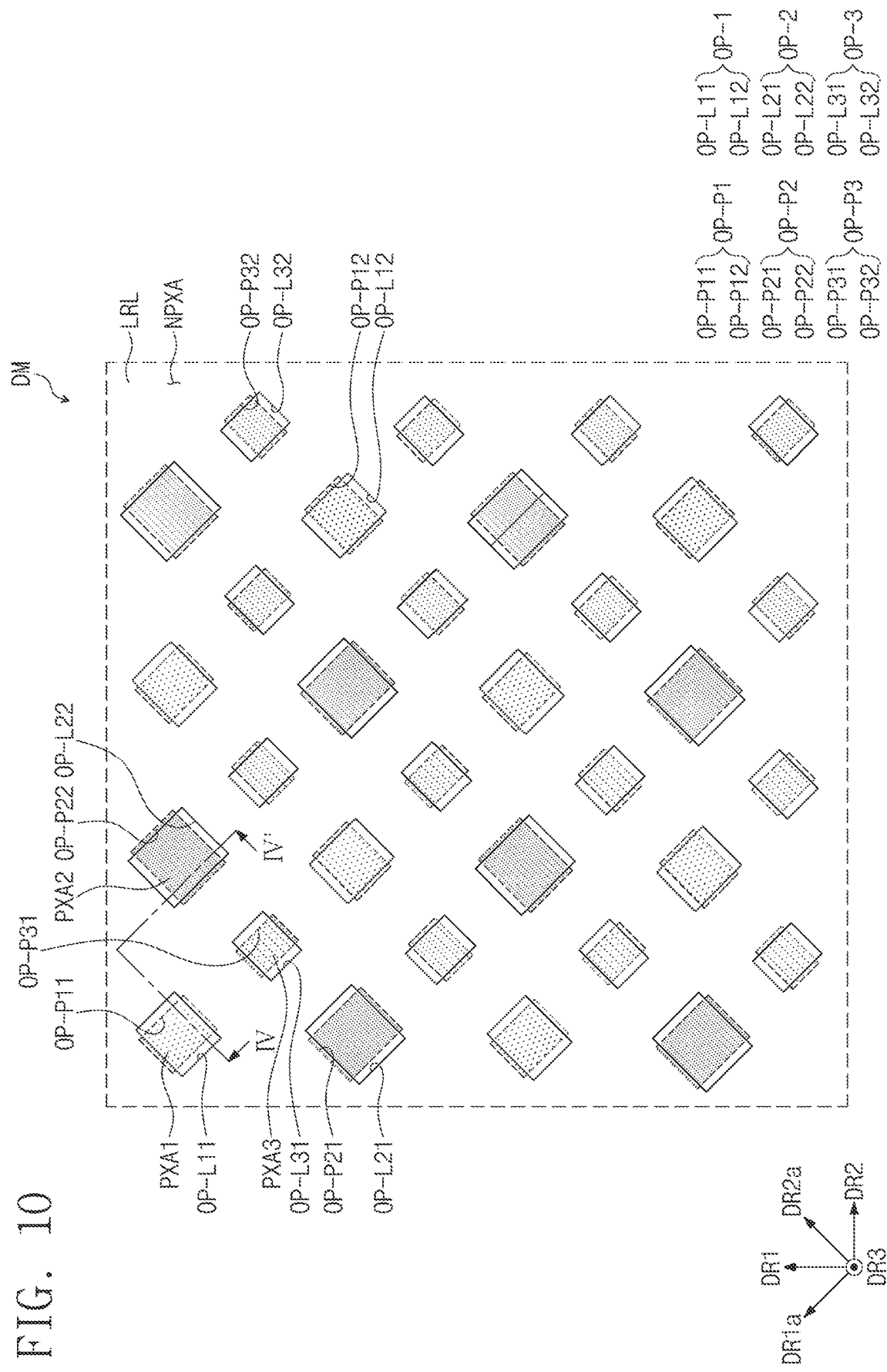

DISPLAY DEVICE

This application claims priority to Korean Patent Application No. 10-2021-0103528, filed on Aug. 6, 2021, and all the benefits accruing therefrom under 35 U.S.C. § 119, the disclosure of which is hereby incorporated by reference in its entirety.

BACKGROUND

(1) Field

The invention relates to a display device, and more particularly, to a display device with increased emission efficiency.

(2) Description of the Related Art

Various electronic apparatus, such as television sets, mobile phones, tablet computers, navigation systems, or game consoles, may be equipped with a display device that displays images. The display device may include a light emitting element which emits a light, such as an organic light emitting element. The light generated from the light emitting element may emit not only in a front direction but also in a lateral direction of the electronic apparatus. The emission efficiency of the display device may depend on an emission direction of the light, and technology development is required to improve the emission efficiency of the display device.

SUMMARY

One or more embodiment of the invention provides a display device with improved emission efficiency.

One or more embodiment of the invention provides a display device whose structure is robust to process variation.

According to an embodiment of the invention, a display device includes a display panel, a first insulating layer on the display panel and having a first refractive index, and a second insulating layer on the first insulating layer and having a second refractive index. The display panel includes a pixel definition layer in which a plurality of emission openings are defined, and a plurality of light emitting elements which respectively correspond to the plurality of emission openings. The first insulating layer may have a plurality of openings which correspondingly overlap the plurality of emission openings. Each of the plurality of emission openings may extend in an extending direction. Each of the plurality of openings may extend in a direction which intersects the extending direction of an overlapped emission opening.

In an embodiment, the plurality of openings may include a first opening which extends in a first direction, and a second opening which extends in a second direction intersecting the first direction.

In an embodiment, the first opening and the second opening may each be provided in plural. The plurality of first openings and the plurality of second openings may be alternately arranged along a third direction which intersects each of the first direction and the second direction.

In an embodiment, the plurality of openings may include first, second, and third opening groups each of which includes the first opening and the second opening. The light emitting elements includes: light emitting elements which overlap corresponding openings of the first opening group may emit the same colored light, light emitting elements which overlap corresponding openings of the second opening group may emit the same colored light, and light emitting elements which overlap corresponding openings of the third opening group may emit the same colored light.

In an embodiment, the openings of the first opening group may be arranged along the first direction. The openings of the second opening group may be arranged along the first direction. The openings of the third opening group may be arranged along a third direction which intersects each of the first direction and the second direction.

In an embodiment, the first opening of the third opening group may be between the openings of the first opening group. The second opening of the third opening group may be between the openings of the second opening group.

In an embodiment, among the plurality of light emitting elements of the display panel, a color of light emitted from light emitting elements which overlap corresponding openings of the first opening group may be different from a color of light emitted from light emitting elements which overlap corresponding openings of the second opening group.

In an embodiment, among the plurality of light emitting elements of the display panel, a color of light emitted from light emitting elements which overlap corresponding openings of the third opening group may be different from the color of light emitted from the light emitting elements which overlap corresponding openings of the first opening group and is different from the color of light emitted from the light emitting elements which overlap corresponding openings of the second opening group. The color of light from the plurality of light emitting elements of the display panel may be one of red, blue, and green.

In an embodiment, each planar area of the openings of the first opening group may be different from each planar area of the openings of the second opening group.

In an embodiment, each planar area of the openings of the third opening group may be less than each planar area of the openings of the first opening group and less than each planar area of the openings of the second opening group.

In an embodiment, each of the first, second, and third opening groups may be provided in plural. The first openings of the first opening groups and the first openings of the second opening groups may be alternately arranged along a third direction which intersects the first direction and the second direction. The first openings of the third opening groups and the second openings of the third opening groups may be alternately arranged along the third direction.

In an embodiment, each of the plurality of emission openings may include a first side which extends along the extending direction. Each of the plurality of openings may include a second side which extends along the extending direction. A minimum interval between the first side and the second side may be equal to or less than about 2 micrometers (μm) when viewed in plan.

In an embodiment, the display device may further include an input sensing layer between the display panel and the first insulating layer. The input sensing layer may include a first conductive layer on the display panel, a touch insulating layer on the first conductive layer, and a second conductive layer on the touch insulating layer. When viewed in plan, the first conductive layer and the second conductive layer may not overlap the plurality of openings.

In an embodiment, the first insulating layer may cover the second conductive layer.

In an embodiment, the first refractive index may be in a range of about 1.3 to about 1.6. The second refractive index may be in a range of about 1.6 to about 1.9.

In an embodiment, the pixel definition layer may include a black pigment or a black dye.

According to an embodiment of the invention, a display device includes a display panel which includes a pixel definition layer in which are defined a plurality of emission openings which correspond to a plurality of emission regions, and an insulating layer on the display panel and in which are defined a plurality of openings which respectively correspond to the plurality of emission openings. The plurality of emission openings may include a plurality of red emission openings which respectively correspond to a plurality of red emission regions, a plurality of blue emission openings which respectively correspond to a plurality of blue emission regions, and a plurality of green emission openings which respectively correspond to a plurality of green emission regions. Each of the red, blue, and green emission openings may include a plurality of first emission openings which extend in a first direction, and a plurality of second emission openings which extend in a second direction intersecting the first direction. The plurality of openings may include a plurality of first openings which correspondingly overlap the first emission openings and extend in the second direction, and a plurality of second openings which correspondingly overlap the second emission openings and extend in the first direction.

In an embodiment, the red emission openings and the blue emission openings may be alternately arranged along a row direction and a column direction which is orthogonal to the row direction. The green emission openings may be arranged along the first and second directions with the red emission openings in between. Each of the row and column directions may intersect the first direction and the second direction.

In an embodiment, the first emission openings of the red emission openings and second emission openings of the red emission openings may be alternately arranged along the first direction. The first emission openings of the blue emission openings and second emission openings of the blue emission openings may be alternately arranged along the first direction.

In an embodiment, the first emission openings of the green emission openings and the red emission openings may be alternately arranged along the first direction across the red emission openings. The second emission openings of the green emission openings and the red emission openings may be alternately arranged along the second direction.

BRIEF DESCRIPTION OF THE DRAWINGS

The above and other advantages and features of this disclosure will become more apparent by describing in further detail embodiments thereof with reference to the accompanying drawings, in which:

FIGS. 2A and 2B illustrate cross-sectional views taken along line I-I' of FIG. 1B, showing a display device according to an embodiment of invention.

FIG. 8 illustrates an enlarged plan view showing a display module according to an embodiment of the invention.

FIG. 10 illustrates an enlarged plan view showing a display module according to an embodiment of the invention.

DETAILED DESCRIPTION

Figure 1A:
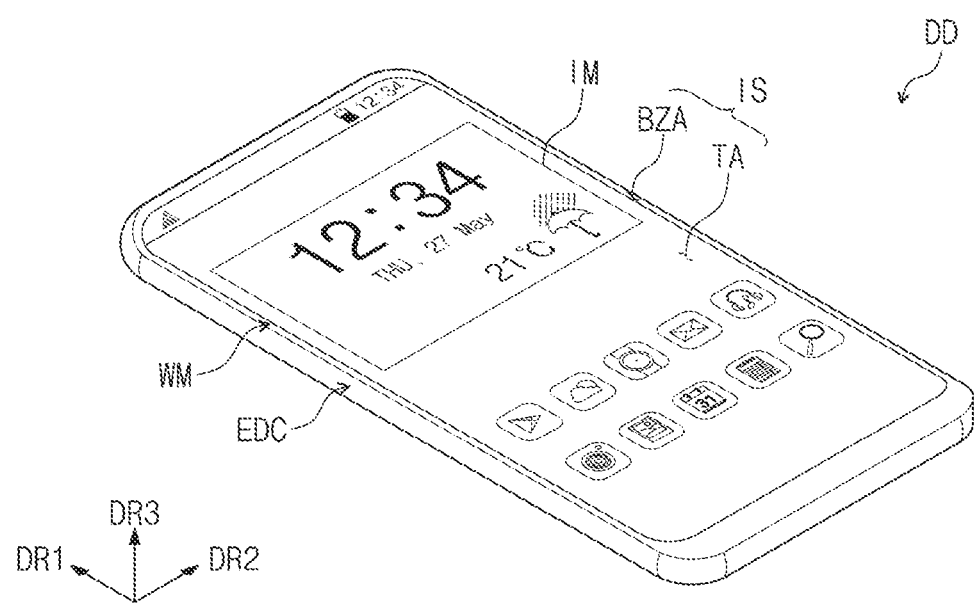
FIG. 1A illustrates a perspective view showing a display device according to an embodiment of the invention.

While the invention opens to various modifications and alternatives embodiments, embodiments thereof are shown by way of example in the drawings and will be described in detail. However, it should be understood that there is no intention to limit the invention to the embodiments disclosed, but on the other hand, the invention is intended to cover all modifications, equivalents, and alternatives falling within the spirit and scope thereof.

In this description, when a component (or region, layer, portion, etc.) is referred to as being related to an element such as being "on", "connected to", or "coupled to" other component(s), the component may be directly disposed on, directly connected to, or directly coupled to the other component(s) or at least one intervening component may be present therebetween. In contrast, when a component (or region, layer, portion, etc.) is referred to as being related to an element such as being "directly on", "directly connected to", or "directly coupled to" other component(s), no intervening component is present therebetween.

Like numerals indicate like components. Moreover, in the drawings, thicknesses, ratios, and dimensions of components are exaggerated for effectively explaining the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combination defined by related components. As used herein, a reference number may indicate a singular element or a plurality of the element. For example, a reference number labeling a singular form of an element within the drawing figures may be used to reference a plurality of the singular element within the text of specification.

It will be understood that, although the terms first, second, etc. may be used herein to describe various components, these components should not be limited by these terms. These terms are only used to distinguish one component from another component. For example, a first component could be termed a second component, and vice versa without departing from the scope of the invention.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The following will describe embodiments of a display device DD in conjunction with the accompanying drawings.

Figure 1B:
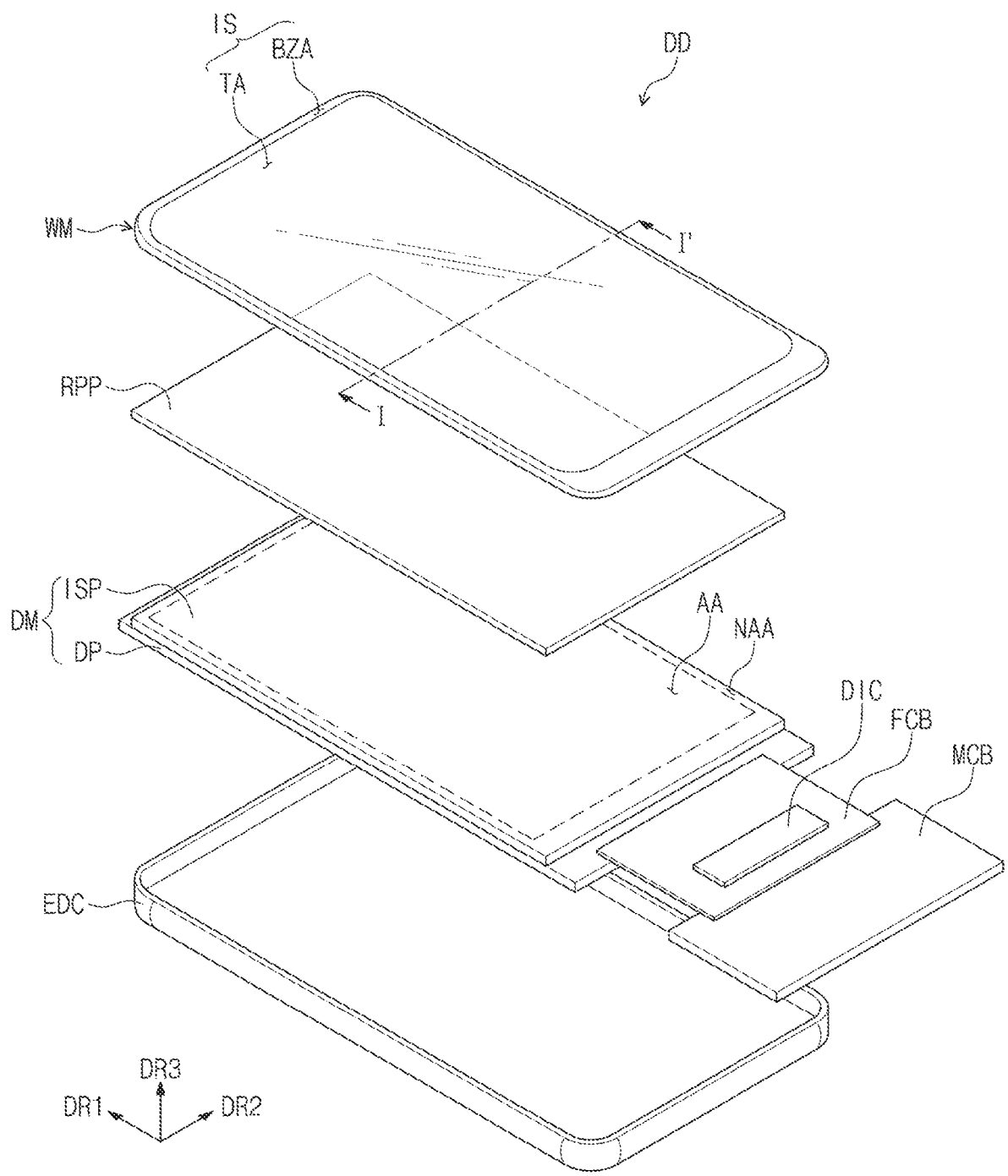
FIG. 1B illustrates an exploded perspective view showing a display device according to an embodiment of the invention.

FIG. 1A illustrates a perspective view showing a display device DD according to an embodiment. FIG. 1B illustrates an exploded perspective view showing the display device DD of FIG. 1A.

A display device DD may be an apparatus that is activated with an electrical signal. The display device DD may include various embodiments. In an embodiment, for example, the display device DD may include a large-sized apparatus for televisions and/or outdoor billboards or a small and medium-sized apparatus for mobile phones, tablet computers, navigation systems, and/or game consoles. These items are merely presented as examples, and the display device DD may be adopted for any other suitable display apparatus so long as it does not depart from the spirit of the invention. In an embodiment, a mobile phone is illustrated by way of example as the display device DD.

Referring to FIG. 1A, the display device DD may display an image IM in a third direction DR3, on (or at) a display surface IS parallel to a plane defined by first and second directions DR1 and DR2 cross each other. The third direction DR3 may be parallel to a direction normal to the display surface IS. The display surface IS that displays the image IM may correspond to a front surface of the display device DD. The image IM may include not only dynamic images but also static images. FIG. 1A shows a plurality of icons as examples of the image IM.

In an embodiment, front surface (or top surface) and rear surface (or bottom surface) of each component are defined based on a direction along which the image IM is displayed. The front and rear surfaces may be opposite to each other in (or along) the third direction DR3, and a normal direction of each of the front and rear surfaces may be parallel to the third direction DR3. An interval in the third direction DR3 between the front and rear surfaces of a member (or unit) may correspond to a thickness (or thickness direction) in the third direction DR3 of the member (or unit). In this description, the phrase "when viewed in plan" may correspond to a state where each member or unit is viewed along the third direction DR3. Directions indicated by the first, second, and third directions DR1, DR2, and DR3 are relative concepts and may denote other directions.

The display device DD may detect an external input that is externally applied. The external input may include any suitable types of inputs that are applied from outside the display device DD. In an embodiment, for example, the external input may include force, pressure, temperature, light, etc. The external input may not only include touch (e.g., contact from an input tool such as a body part like a user's hand, or pen) in contact with the display device DD, but also include any input (e.g., hovering) that approaches close to or adjacent to the display device DD at a suitable distance (e.g., a predetermined distance).

The display surface IS of the display device DD may be divided into a transmission region TA and a bezel region BZA. The transmission region TA may be a zone on which an image IM is displayed. The image IM may be viewable through the transmission region TA. In an embodiment, the transmission region TA is illustrated as being of a rectangular shape with rounded vertices. This, however, is merely an example, and the transmission region TA may have a circular shape, a polygonal shape, or any other suitable shape when viewed in plan (e.g., a plan view or plan view). The transmission region TA may have a curved or three-dimensional shape without being limited to a planar shape, and the invention is not limited to a particular embodiment.

The bezel region BZA may be a light-shielding region having a color. The bezel region BZA may be adjacent to the transmission region TA. The bezel region BZA may be disposed outside the transmission region TA and may surround the transmission region TA. Therefore, the bezel region BZA may substantially define the shape of the transmission region TA. This, however, is illustrated as an example, and the bezel region BZA may be adjacent to only one side of the transmission region TA or may be omitted. The bezel region BZA may be disposed not on the front surface but on a lateral surface of the display device DD.

In an embodiment, the display device DD may be flexible. The term "flexible" may indicate the meaning of "being capable of being flexed", and may include not only "being capable of completely folded" but also "being capable of bent to a degree of several nanometers." In an embodiment, for example, the flexible display device DD may be a curvable display device or a foldable display device. The invention, however, is not limited thereto, and the display device DD may be rigid.

Referring to FIGS. 1A and 1B, the display device DD may include a window WM and an outer casing EDC. The window WM and the outer casing EDC may be combined to construct an outer appearance of the display device DD, and may provide an inner space that accommodates components of the display device DD. The display device DD may include a display module DM and an anti-reflection member RPP that are disposed between the window WM and the outer casing EDC.

The window WM may be disposed on the anti-reflection member RPP, such as to face the anti-reflection member RPP. The window WM may protect internal components of the display device DD from external impact. A front surface of the window WM may correspond to the display surface IS of the display device DD, and may include the transmission region TA and the bezel region BZA.

The transmission region TA of the window WM may be an optically transparent region. The window WM may transmit an image IM provided from the display module DM, and the image IM may be viewable from outside the display device DD, through the window WM. The bezel region BZA of the window WM may be provided as a zone on which is printed a material with a color. The bezel region BZA of the window WM may prevent (or reduce) a component of the display module DM disposed to overlap the bezel region BZA, from being externally visible.

The display module DM may be disposed on the outer casing EDC. In response to an electrical signal, the display module DM may display an image IM, and may receive and/or transfer information about an external input. The display module DM may include an active region AA and a peripheral region NAA which is adjacent to the active region AA.

The active region AA may be a zone activated with an electric signal. The active region AA may be defined as a zone that displays an image IM provided from the display module DM. According to an embodiment, the active region AA of the display module DM may correspond to at least a portion of the transmission region TA. An image IM displayed on the active region AA may be externally visible through the transmission region TA.

The peripheral region NAA may surround the active region AA. This, however, is merely an example, and the peripheral region NAA is not limited to a particular embodiment and may be defined to have various shapes. The peripheral region NAA may be a zone on which are disposed one or more driver circuits, driver lines, various kinds of electrical signal lines, and pads for driving elements disposed on the active region AA. The peripheral region NAA may overlap at least a portion of the bezel region BZA.

The display module DM may include a display panel DP and an input sensing member ISP. The display panel DP may generate an image IM, and the input sensing member ISP may obtain coordinate information of an external input (e.g., touch event). The display module DM may further include a main circuit board MCB, a flexible circuit board FCB, and a driver chip DIC.

The display panel DP according to an embodiment may be an emissive display panel, but the invention is not limited thereto. In an embodiment, for example, the display panel DP may be an organic light emitting display panel, an inorganic light emitting display panel, or a quantum-dot light emitting display panel. An emission layer of the organic light emitting display panel may include an organic light emitting material, and an emission layer of the inorganic light emitting display panel may include an inorganic light emitting material. An emission layer of the quantum-dot light emitting display panel may include a quantum-dot or/and a quantum-rod. The following will describe an example in which an organic light emitting display panel is used as the display panel DP.

The input sensing member ISP may be disposed on the display panel DP. The input sensing member ISP according to an embodiment may be directly disposed on the display panel DP. In this description, the phrase "directly disposed" may indicate the meaning of "formed by a series of successive processes with no separate adhesion layer or adhesive member." The phrase "the input sensing member ISP is directly disposed on the display panel DP" may denote that after the display panel DP is formed, the input sensing member ISP is formed on a base surface provided by the display panel DP by a series of successive processes with no separate adhesion layer. The invention, however, is not limited thereto, and the input sensing member ISP may be formed separately from the display panel DP and may then be attached through an adhesion layer to a top surface of the display panel DP.

The main circuit board MCB may be coupled to the flexible circuit board FCB, thereby being electrically connected to the display panel DP. The main circuit board MCB may include driver elements. The driver elements may include a circuit for driving the display panel DP.

The flexible circuit board FCB may be coupled to the display panel DP to electrically connect the display panel DP to the main circuit board MCB. That is, the flexible circuit board FCB connects the main circuit board MCB to the display panel DP. FIG. 1B shows by way of example a single flexible circuit board FCB, but the invention is not limited thereto. In an embodiment, for example, a plurality of flexible circuit boards FCB may be provided and the plurality of flexible circuit boards FCB may each be coupled to the display panel DP.

The driver chip DIC may be mounted on the flexible circuit board FCB. The driver chip DIC may include driver elements, such as data driver circuit, for driving pixels of the display panel DP. FIG. 1B shows a structure in which the driver chip DIC is mounted on the flexible circuit board FCB, but the invention is not limited thereto. In an embodiment, for example, the driver chip DIC may be directly mounted on the display panel DP. In this case, the display panel DP may be bendable at a portion on which the driver chip DIC is mounted and the display panel DP which is bent may dispose the driver chip DIC on a rear surface of the display module DM.

The input sensing member ISP may be electrically connected through the flexible circuit board FCB, to the main circuit board MCB. This invention, however, is not limited thereto, and the display module DM may additionally include another flexible circuit board FCB for an electrical connection between the input sensing member ISP and the main circuit board MCB.

The anti-reflection member RPP may be disposed between the display module DM and the window WM. The anti-reflection member RPP may reduce a reflectance of external light that is incident from an upper side of the display device DD.

The anti-reflection member RPP according to an embodiment may include a retarder and a polarizer. The retarder may include a $\lambda/2$ retarder and/or a $\lambda/4$ retarder. Each of the retarder and the polarizer may be film type or liquid crystal coating type. The film-type polarizer may include a flexible synthetic resin film, and the liquid-crystal-coating-type polarizer may include liquid crystals that are specifically arranged. The invention, however, is not limited thereto, and the retarder and the polarizer may be integrally provided as a single polarizing film.

The anti-reflection member RPP may further include a protection film disposed on an upper or lower side of the polarizing film. This invention, however, is not limited thereto, and the anti-reflection member RPP according to an embodiment may include color filters and may further include a black matrix adjacent to the color filters.

The outer casing EDC may be disposed below the display module DM to accommodate the display module DM. The outer casing EDC may absorb externally applied impact and may prevent the display module DM from receiving foreign substances and/or moisture, thereby protecting components accommodated within the outer casing EDC. The outer casing EDC according to an embodiment may be provided as a structure in which a plurality of accommodation members are combined with each other.

The display device DD according to an embodiment may further include an electronic module that includes various functional modules for driving the display module DM, a power supply module that supplies a power required for the display device DD, and a bracket that is coupled to one or more of the display module DM and the outer casing EDC to thereby divide an inner space of the display device DD.

FIGS. 2A and 2B illustrate cross-sectional views taken along line I-I' of FIG. 1B, showing a display device DD according to embodiments. FIGS. 2A and 2B simply show various embodiments according to a staked shape of components included in the display device DD. A description above may be identically applicable to components of the display device DD shown in FIGS. 2A and 2B.

Referring to FIGS. 2A and 2B, the window WM according to an embodiment may include a base substrate WBB and a bezel pattern WBM. The base substrate WBB may include an optically transparent insulating material. The base substrate WBB may include one or more of a glass substrate and a synthetic resin film. The base substrate WBB may have a single-layered or multi-layered structure. The base substrate WBB may further be provided thereon with one or more functional layers such as an anti-fingerprint layer, an optical layer that controls a phase, and a coating layer.

The bezel pattern WBM may be a color layer formed (or provide) on one surface of the base substrate WBB. The bezel pattern WBM may have a single-layered or multi-layered structure. The multi-layered structured bezel pattern WBM may include a chromatic color layer and an achromatic light-shield layer (e.g., with a black color). The bezel pattern WBM may be formed on the bezel pattern WBM by a deposition, printing, or coating process. A zone where the bezel pattern WBM is disposed may substantially correspond to the bezel region BZA of the window WM.

Referring to FIG. 2A, the window WM and the anti-reflection member RPP may be coupled through respective adhesion layers AF1 and AF2, to components that are correspondingly disposed below the window WM and the anti-reflection member RPP. The anti-reflection member RPP may be attached to the display module DM through a first adhesion layer AF1. In an embodiment, for example, the anti-reflection member RPP may be fixed through the first adhesion layer AF1 to a top surface of the input sensing member ISP. The window WM may be attached through a second adhesion layer AF2 to the anti-reflection member RPP.

Each of the first and second adhesion layers AF1 and AF2 may include a transparent adhesive, such as an optically clear adhesive (OCA) film, an optically clear resin (OCR), or a pressure sensitive (PSA) film. The first and second adhesion layers AF1 and AF2, however, are not limited to the examples mentioned above.

Referring to FIG. 2B, the anti-reflection member RPP may be directly disposed on the display module DM. In an embodiment, for example, the anti-reflection member RPP may be formed on the input sensing member ISP by a series of successive processes. In an embodiment, for example, the anti-reflection member RPP may be formed by coating (or printing) and patterning a composition of a color filter on a base surface that is provided by the input sensing member ISP. As the anti-reflection member RPP is directly disposed on the display module DM, the first adhesion layer AF1 of FIG. 2A may be omitted.

Figure 3:
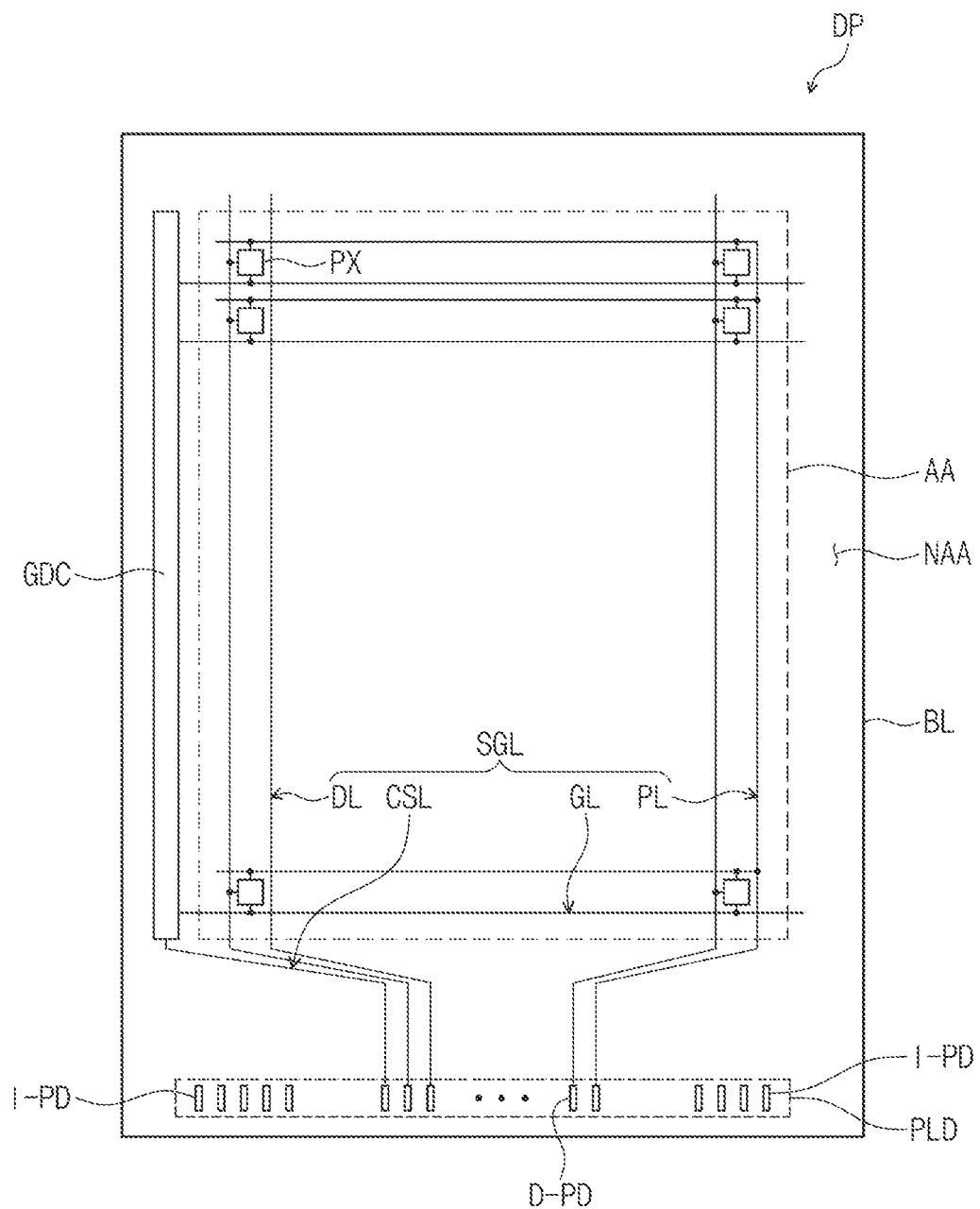
FIG. 3 illustrates a plan view showing a display panel according to an embodiment of the invention.
Figure 4:
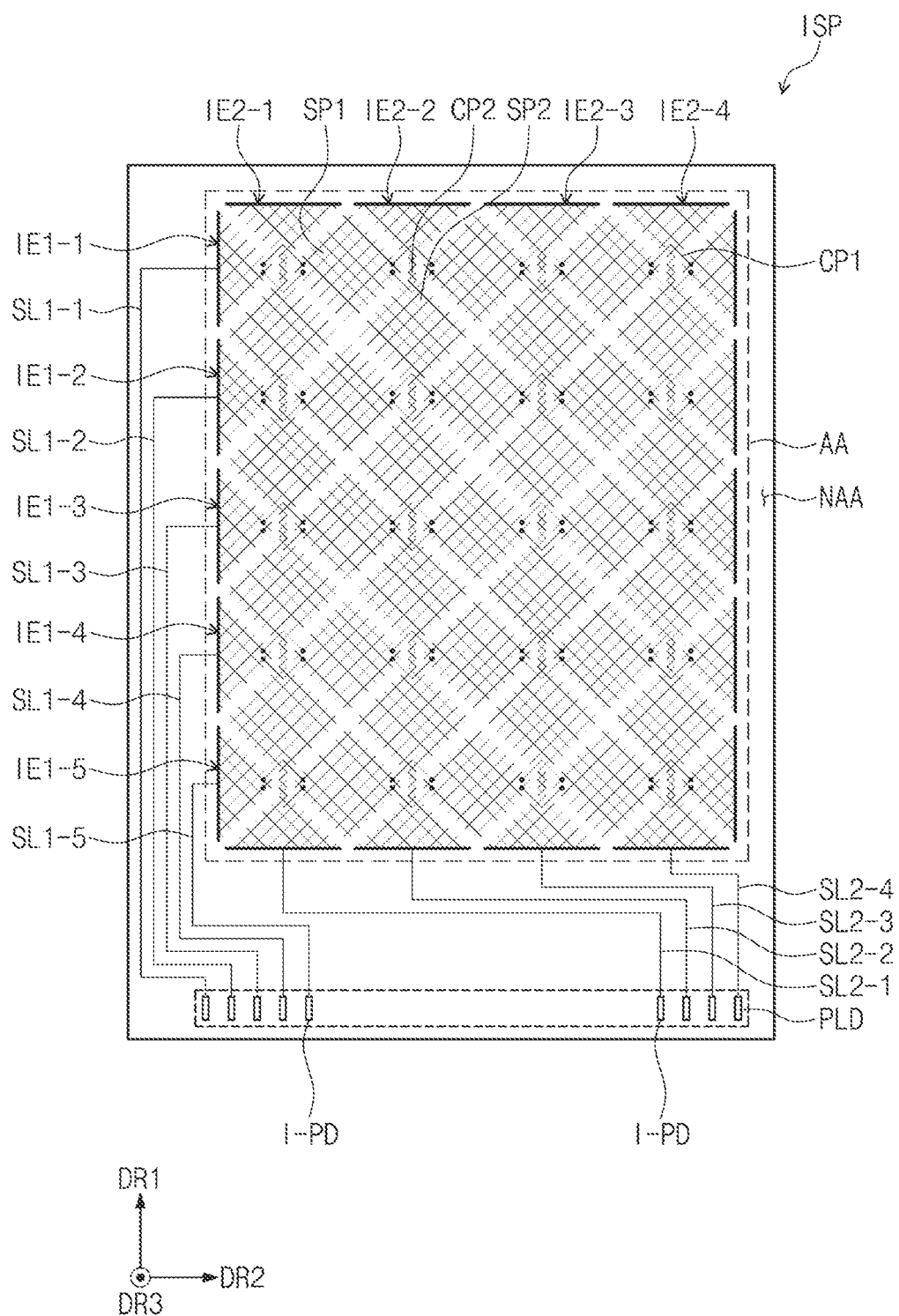
FIG. 4 illustrates a plan view showing an input sensing layer according to an embodiment of the invention.

FIG. 3 illustrates a plan view showing a display panel DP according to an embodiment. FIG. 4 illustrates a plan view showing an input sensing member ISP according to an embodiment.

Referring to FIG. 3, the display panel DP may include a base layer BL that is divided into the active region AA and the peripheral region NAA. The display panel DP may include a pixel PX provided in plural and may include a plurality of pixels PX disposed on the active region AA and signal lines SGL which are electrically connected to the pixels PX. The display panel DP may include a driver circuit GDC and a pad section PLD that are disposed on the peripheral region NAA.

Each of the pixels PX may include a light emitting element and a pixel driver circuit which is connected to the light emitting element, which will be discussed below. The signal lines SGL may include gate lines GL, data lines DL, a power line PL, and a control signal line CSL. Each of the gate lines GL may be connected to a corresponding one of the pixels PX, and each of the data lines DL may be connected to a corresponding one of the pixels PX. The power line PL may be electrically connected to the pixels PX. The control signal line CSL may be connected to the driver circuit GDC and may provide the driver circuit GDC with control signals.

The driver circuit GDC may include a gate driver circuit. The gate driver circuit may generate gate signals, and the generated gate signals may be sequentially output to the gate lines GL. The gate driver circuit may further output different control signals to the pixel driver circuit.

The display panel DP may be connected to the flexible circuit board FCB of FIG. 1B, at the pad section PLD. The pad section PLD may include pixel pads D-PD and input pads I-PD. The pixel pads D-PD may connect the flexible circuit board FCB to the display panel DP. The input pads I-PD may connect the flexible circuit board FCB to the input sensing member ISP.

Each of the pixel pads D-PD may be connected to a corresponding one of the signal lines SGL. Each of the pixel pads D-PD may be connected through the signal line SGL to a corresponding pixel PX. In addition, one of the pixel pads D-PD may be connected to the driver circuit GDC.

Referring to FIG. 4, the input sensing member ISP according to an embodiment may include a plurality of sensing electrodes and a plurality of sensing signal lines. The input sensing member ISP may include first sensing electrodes IE1-1 to IE1-5 and second sensing electrodes IE2-1 to IE2-4. The input sensing member ISP may include first signal lines SL1-1 to SL1-5 connected to the first sensing electrodes IE1-1 to IE1-5 and may include second signal lines SL2-1 to SL2-4 connected to the second sensing electrodes IE2-1 to IE2-4.

The first sensing electrodes IE1-1 to IE1-5 may intersect the second sensing electrodes IE2-1 to IE2-4. The first sensing electrodes IE1-1 to IE1-5 may extend along the second direction DR2 and may be arranged along the first direction DR1. The second sensing electrodes IE2-1 to IE2-4 may extend along the first direction DR1 and may be arranged along the second direction DR2. The first sensing electrodes IE1-1 to IE1-5 and the second sensing electrodes IE2-1 to IE2-4 may be electrically insulated from each other.

The first signal lines SL1-1 to SL1-5 and the second signal lines SL2-1 to SL2-4 may be disposed on (or in) the peripheral region NAA. The first signal lines SL1-1 to SL1-5 and the second signal lines SL2-1 to SL2-4 may be correspondingly connected to the input pads I-PD disposed on the peripheral region NAA.

Each of the first signal lines SL1-1 to SL1-5 may be connected to an end of a corresponding one of the first sensing electrodes IE1-1 to IE1-5. At least one the first signal lines SL1-1 to SL1-5 may be connected to one end of a corresponding one of the first sensing electrodes IE1-1 to IE1-5, and another one of the first signal lines SL1-1 to SL1-5 may be connected to another end of the corresponding one of the first sensing electrodes IE1-1 to IE1-5, but the invention is not limited thereto.

Each of the second signal lines SL2-1 to SL2-4 may be connected to an end of a corresponding one of the second sensing electrodes IE2-1 to IE2-4. The input sensing member ISP may further include sensing signal lines connected to other ends of the second sensing electrodes IE2-1 to IE2-4, but the invention is not limited to one embodiment.

Each of the first sensing electrodes IE1-1 to IE1-5 may include first sensors SP1 and first connectors CP1 that are disposed on the active region AA. Within one first sensing electrode, the first sensors SP1 may be arranged along the second direction DR2. Each of the first connectors CP1 may connect the first sensors SP1 that are adjacent to each other along the second direction DR2, to each other.

Each of the second sensing electrodes IE2-1 to IE2-4 may include second sensors SP2 and second connectors CP2 that are disposed on the active region AA. Within one second sensing electrode, the second sensors SP2 may be arranged along the first direction DR1. Each of the second connectors CP2 may connect the second sensors SP2 that are adjacent to each other along the first direction DR1, to each other.

The first sensors SP1 of the first sensing electrodes IE1-1 to IE1-5, the second sensors SP2 of the second sensing electrodes IE2-1 to IE2-4, and the second connectors CP2 may be formed at the same layer. As being at or on a same layer, elements may be in a same layer as each other as respective portions of a same material layer, may form an interface with a same underlying or overlying layer, etc., without being limited thereto. Within one first sensing electrode, the first sensors SP1 may be spaced apart from each other across the second sensing electrodes IE2-1 to IE2-4 formed at the same layer. The first connectors CP1 may be formed at a different layer from that of the first sensors SP1, and when viewed in plan, the first connectors CP1 may overlap the first sensors SP1. The first connector CP1 may be electrically connected to the first sensors SP1 that overlap the first connectors CP1, and may electrically connect neighboring first sensors SP1 to each other.

The first sensing electrodes IE1-1 to IE1-5 and the second sensing electrodes IE2-1 to IE2-4 may each have a mesh shape defined by solid portions spaced apart from each other. As the first sensing electrodes IE1-1 to IE1-5 and the second sensing electrodes IE2-1 to IE2-4 have mesh shapes, a parasitic capacitance between electrodes of the display panel DP (of FIG. 3) and the first and second sensing electrodes IE1-1 to IE1-5 and IE2-1 to IE2-4, may be reduced. In addition, the first and second sensing electrodes IE1-1 to IE1-5 and IE2-1 to IE2-4 may not overlap emission regions of the display panel DP (of FIG. 3), and may thus be prevented from being visible from outside the display device DD.

Each of the first and second sensing electrodes IE1-1 to IE1-5 and IE2-1 to IE2-4 may include one or more of silver, aluminum, copper, chromium, nickel, and titanium that are capable of being processed at low temperatures. Therefore, even when a series of successive processes is performed to form the input sensing member ISP on the display panel DP, a low-temperature process may be possible to prevent damage to light emitting elements of the display panel DP. The material of the first and second sensing electrodes IE1-1 to IE1-5 and IE2-1 to IE2-4 is not limited to the example mentioned above.

FIG. 4 shows by way of example the first sensing electrodes IE1-1 to IE1-5 and the second sensing electrodes IE1-1 to IE1-4 according to an embodiment, and no limitation is imposed on the shape of sensing electrodes. In an embodiment, the first and second sensing electrodes IE1-1 to IE1-5 and IE2-1 to IE2-4 may each have a shape (e.g., a bar shape) where no distinction is made between a sensor and a connector. In addition, FIG. 4 shows by way of example the first and second sensors SP1 and SP2 having rhombic shapes as a planar shape, but the first and second sensors SP1 and SP2 may have various polygonal shapes without being limited to the shape discussed above.

Figure 5:
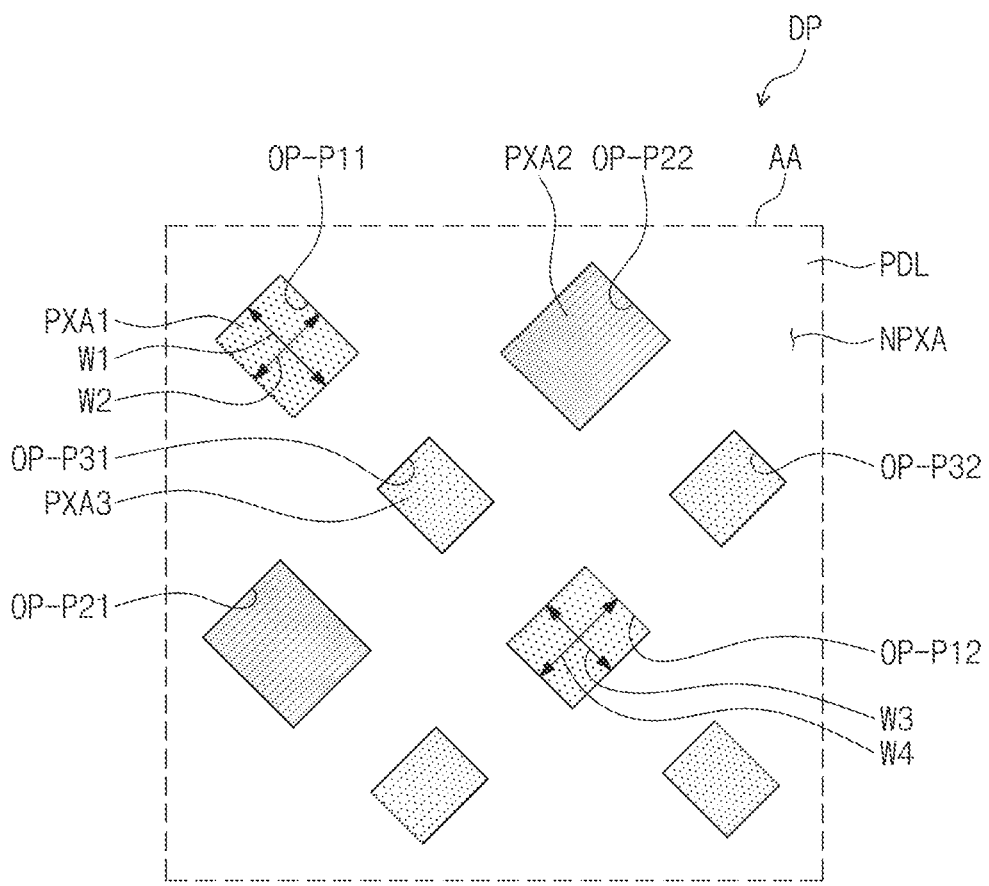
FIG. 5 illustrates an enlarged plan view showing a display panel according to an embodiment of the invention.
Figure 6:
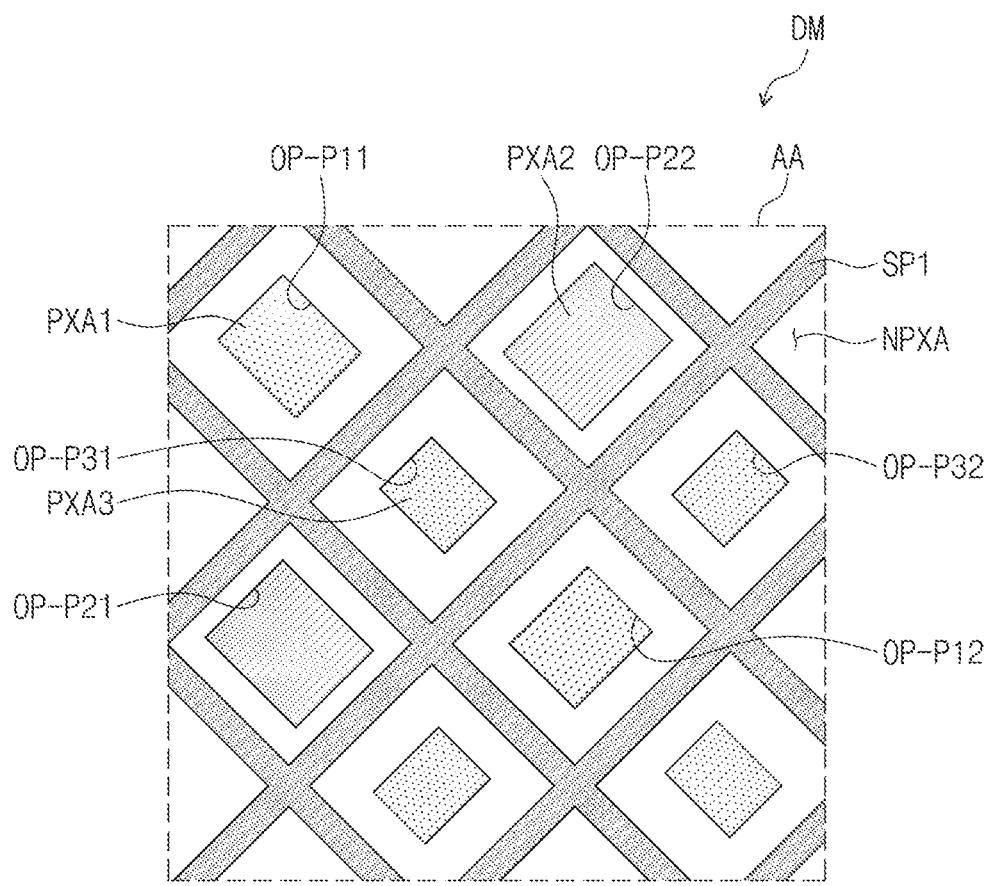
FIG. 6 illustrates an enlarged plan view showing a display module according to an embodiment of the invention.

FIG. 5 illustrates an enlarged plan view partially showing an active region AA of a display panel DP according to an embodiment. FIG. 6 illustrates an enlarged plan view that corresponds to the plan view of FIG. 5, showing a display module DM according to an embodiment.

Referring to FIG. 5, the active region AA of the display panel DP may include a plurality of emission regions PXA1, PXA2, and PXA3 (e.g., light emission regions) and a non-emission region NPXA. The plurality of emission regions PXA1, PXA2, and PXA3 may be zones from each of which light is emitted. The non-emission region NPXA may surround the plurality of emission regions PXA1, PXA2, and PXA3 and may establish boundaries between the plurality of emission regions PXA1, PXA2, and PXA3.

The display panel DP may include a pixel definition layer PDL in which a plurality of emission openings are defined and may also include a plurality of light emitting elements that are disposed to correspond to the plurality of emission openings. The plurality of emission openings may have planar areas each of which corresponds to that of a corresponding one of the plurality of emission regions PXA1, PXA2, and PXA3. A zone where a solid portion of the pixel definition layer PDL is disposed may correspond to the non-emission region NPXA and may prevent a mixture of light emitted from the plurality of emission regions PXA1, PXA2, and PXA3.

A first intersection direction DR1$a$ (e.g., a fourth direction) and a second intersection direction DR2$a$ (e.g., fifth direction) may be defined to intersect each of the first direction DR1 and the second direction DR2. An acute angle may be formed between the first intersection direction DR1$a$ and the first direction DR1 and between the second intersection direction DR2$a$ and the second direction DR2. The first and second intersection directions DR1$a$ and DR2$a$ may be orthogonal to each other. In this description, the first direction DR1 may be defined as a column direction, and the second direction DR2 may be defined as a row direction.

The plurality of emission regions PXA1, PXA2, and PXA3 may include first emission regions PXA1, second emission regions PXA2, and third emission regions PXA3. Each of the first, second, and third emission regions PXA1, PXA2, and PXA3 may emit light whose color is different from that of light emitted from another of the first, second, and third emission regions PXA1, PXA2, and PXA3. In an embodiment, for example, the first emission regions PXA1 may each be a zone that emits a first color. The second emission regions PXA2 may each be a zone that emits a second color. The third emission regions PXA3 may each be a zone that emits a third color. In an embodiment, for example, the first emission regions PXA1 may emit a red light, the second emission regions PXA2 may emit a blue light, and the third emission regions PXA3 may emit a green light. The invention, however, is not limited thereto, and colors of the light emitted from the first, second, and third emission regions PXA1, PXA2, and PXA3 may be arbitrarily chosen as long as a combination of the colors produces a white light. Alternatively, the first, second, and third emission regions PXA1, PXA2, and PXA3 may emit the same colored light.

The plurality of emission openings may include a first emission opening group OP-P1, a second emission opening group OP-P2, and a third emission opening group OP-P3. The emission openings of the first emission opening group OP-P1 may correspond to the first emission regions PXA1. The emission openings of the second emission opening group OP-P2 may correspond to the second emission regions PXA2. The emission openings of the third emission opening group OP-P3 may correspond to the third emission regions PXA3. In an embodiment, for example, the emission openings of the first emission opening group OP-P1 may correspond to zones each of which emits a red light, the emission openings of the second emission opening group OP-P2 may correspond to zones each of which emits a blue light, and the emission openings of the third emission opening group OP-P3 may correspond to zones each of which emits a green light.

The emission openings of the first, second, and third emission opening groups OP-P1, OP-P2, and OP-P3 may have different areas (e.g., size or dimension) when viewed in plan. In an embodiment, for example, among the first, second, and third emission opening groups OP-P1, OP-P2, and OP-P3, the emission opening of the second emission opening group OP-P2 may have the largest area, and the emission opening of the third emission opening group OP-P3 may have the smallest area. The invention, however, is not limited thereto to, and the area of the emission opening may be designed in consideration of emission efficiency of light emitted through the emission opening.

Each of the first, second, and third emission opening groups OP-P1, OP-P2, and OP-P3 may include the emission openings that extend in one direction. Each of the first, second, and third emission opening groups OP-P1, OP-P2, and OP-P3 may include the emission openings that have a major dimension extending in the one direction as an extending direction. The first, second, and third emission opening groups OP-P1, OP-P2, and OP-P3 may respectively include emission openings (referred to hereinafter as a first emission opening OP-P11, a third emission opening OP-P21, and a fifth emission opening OP-P31) that have the major dimension which extends along the first intersection direction DR1a, and may respectively include emission openings (referred to hereafter as a second emission opening OP-P12, a fourth emission opening OP-P22, and a sixth emission opening OP-P32) that have the major dimension which extends along the second intersection direction DR2a.

In an embodiment, for example, the first emission opening group OP-P1 may include the first emission opening OP-P11 and the second emission opening OP-P12 that extend in different directions. The first and second emission openings OP-P11 and OP-P12 included in the first emission opening group OP-P1 may have the same area.

The first emission opening OP-P11 of the first emission opening group OP-P1 may have a first width W1 in the first intersection direction DR1a and a second width W2 in the second intersection direction DR2a. The first width W1 may be greater than the second width W2 to define the major direction, and thus it may be stated that the first emission opening OP-P11 extends along the first intersection direction DR1a.

The second emission opening OP-P12 of the first emission opening group OP-P1 may have a third width W3 in the first intersection direction DR1a and a fourth width W4 in the second intersection direction DR2a. The fourth width W4 may be greater than the third width W3. Therefore, it may be stated that the second emission opening OP-P12 extends along the second intersection direction DR2a.

Along the same first intersection direction DR1a, the first width W1 of the first emission opening OP-P11 may be greater than the third width W3 of the second emission opening OP-P12. The first width W1 of the first emission opening OP-P11 may be substantially the same as the fourth width W4 of the second emission opening OP-P12, along respective intersection directions.

Likewise, the second emission opening group OP-P2 may include the third emission opening OP-P21 and the fourth emission opening OP-P22 whose areas are the same as each other and whose extending directions are different from each other. The third emission opening group OP-P3 may include the fifth emission opening OP-P31 and the sixth emission opening OP-P32 whose areas are the same as each other and whose extending directions are different from each other.

FIG. 5 shows by way of example that the first, second, and third emission opening groups OP-P1, OP-P2, and OP-P3 have emission openings each of which is shaped like a tetragonal shape that has a major dimension which extends in one direction. The invention, however, is not limited thereto, and at least one of the emission openings may have an oval or polygonal shape that has a major dimension which extends along one direction, and no limitation is imposed on the shape of the emission openings.

The first, second, and third emission opening groups OP-P1, OP-P2, and OP-P3 have emission openings that are regularly arranged.

The first and second emission opening group OP-P1 and OP-P2 may have emission openings that are alternately arranged along the first direction DR1 and the second direction DR2. In an embodiment, for example, the first emission opening OP-P11 and the third emission opening OP-P21 may be arranged along the first direction DR1, and the second emission opening OP-P12 and the fourth emission opening OP-P22 may be arranged along the first direction DR1. The first emission opening OP-P11 and the fourth emission opening OP-P22 may be arranged along the second direction DR2 and the second emission opening OP-P12 and the third emission opening OP-P21 may be arranged along the second direction DR2.

The third emission opening group OP-P3 may have emission openings that are arranged consecutively along the first direction DR1 and the second direction DR2. In an embodiment, for example, the fifth and sixth emission openings OP-P31 and OP-P32 of the third emission opening group OP-P3 may be consecutively arranged along the first direction DR1 and the second direction DR2.

The emission openings of the first and second emission opening groups OP-P1 and OP-P2, and the emission openings of the third emission opening group OP-P3, may be staggeringly arranged in the first direction DR1. Some of the emission openings of the third emission opening group OP-P3 and the emission openings of the first emission opening group OP-P1 may be arranged along the first intersection direction DR1a, and others of the emission openings of the third emission opening group OP-P3 and the emission openings of the second emission opening group OP-P2 may be arranged along the first intersection direction DR1a.

In an embodiment, for example, the first emission opening OP-P11 and the second emission opening OP-P12 may be arranged in the first intersection direction DR1a with the fifth emission opening OP-P31 interposed therebetween. The third emission opening OP-P21 and ones of the sixth emission openings OP-P32 (e.g., first portion) may be arranged along the first intersection direction DR1a, and the fourth emission opening OP-P22 and remaining ones of the sixth emission openings OP-P32 (e.g., second portion) may be arranged along the first intersection direction DR1a. The third emission opening OP-P21 and the fourth emission opening OP-P22 may be arranged in the second intersection direction DR2a with the fifth emission opening OP-P31 interposed therebetween.

FIG. 5 shows by way of example an arrangement of the first, second, and third emission opening groups OP-P1, OP-P2, and OP-P3, and the invention is not limited to the arrangement shown in FIG. 5.

Referring to FIG. 6, the display module DM may include the display panel DP (of FIG. 3) and the input sensing member ISP (of FIG. 4) disposed on the display panel DP (of FIG. 3). FIG. 6 shows a simplified plan view showing an example in which the first sensor SP1 is disposed on the display panel DP of FIG. 5.

The first sensors SP1 of the input sensing member ISP (of FIG. 4) may have a mesh shape. The solid portions of the mesh-shaped first sensors SP1 may be disposed to correspond to the non-emission region NPXA and openings between the solid portions may be disposed to correspond to the first, second, and third emission regions PXA1, PXA2, and PXA3, so as to reduce a parasitic capacitance while increasing areas of the first, second, and third emission regions PXA1, PXA2, and PXA3. Therefore, the first sensors SP1 may be disposed to overlap none of the first, second, and third emission regions PXA1, PXA2, and PXA3. The solid portions of the first sensors SP1 may be disposed spaced apart from the first, second, and third emission regions PXA1, PXA2, and PXA3, without being limited thereto. Likewise, the second sensors SP2 (of FIG. 4) may have a mesh shape and solid portions thereof may be disposed overlapping the non-emission region NPXA.

Figure 7A:
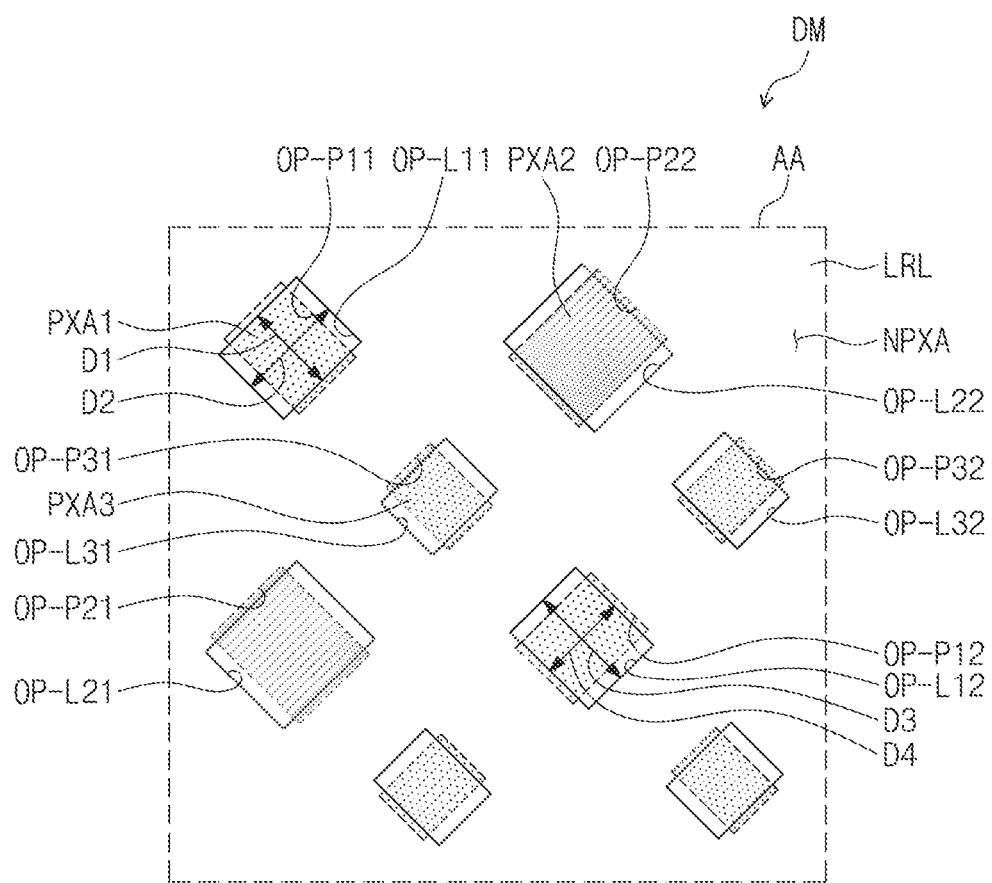
FIGS. 7A to 7C illustrate enlarged plan views showing a display module according to an embodiment of the invention.
Figure 7B:
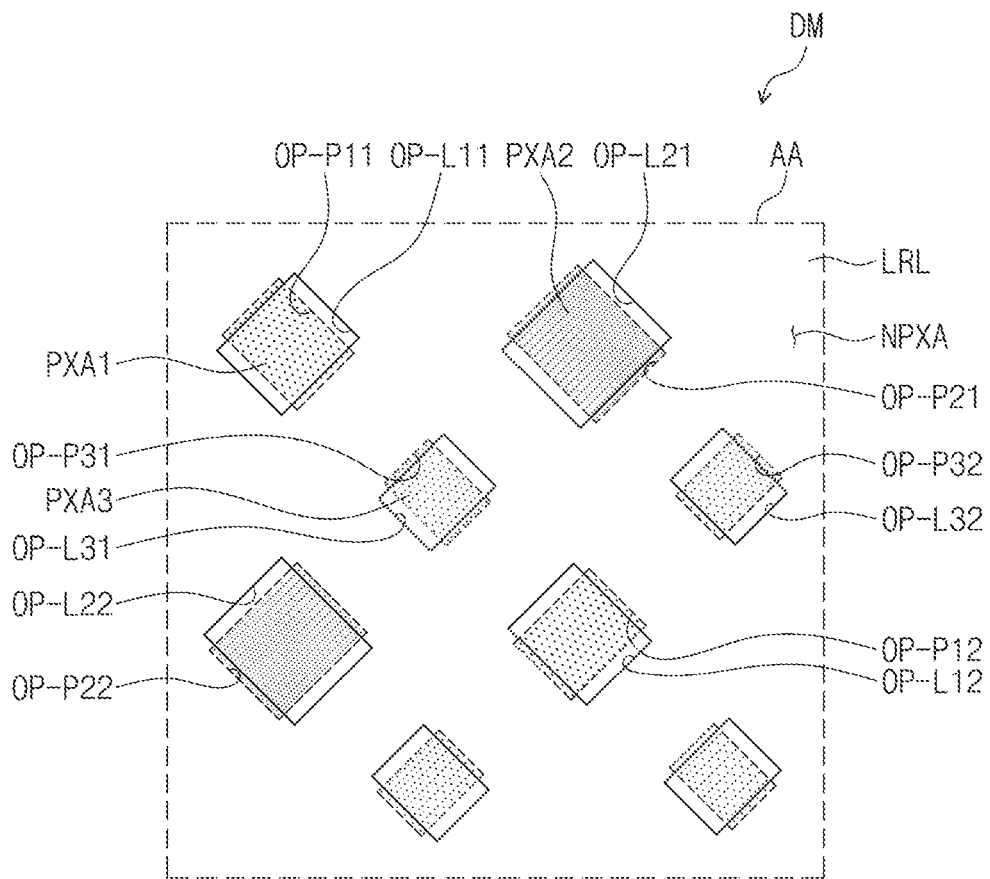
Figure 7C:
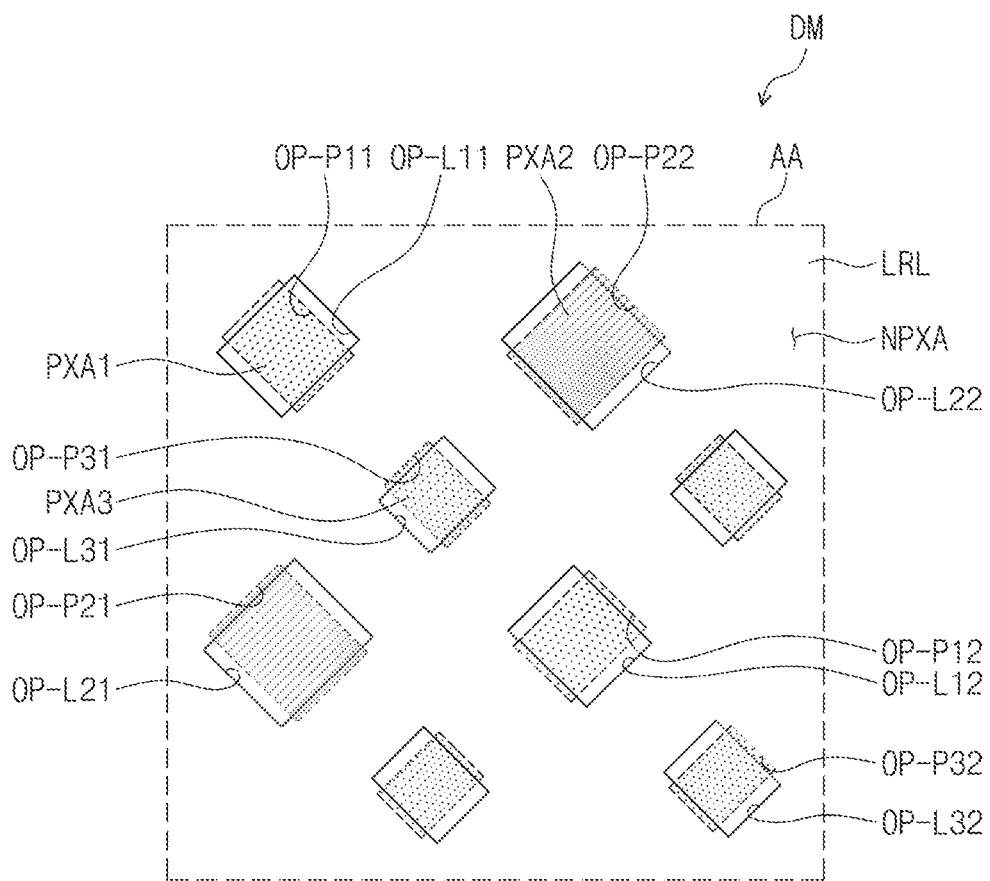

FIGS. 7A to 7C illustrate enlarged plan views that correspond to the enlarged plan view of FIG. 5, showing a display module DM according to an embodiment. Referring to FIGS. 7A to 7C, the input sensing member ISP (of FIGS. 9A and 9B) of the display module DM may include a first insulating layer LRL. The first insulating layer LRL may be disposed on sensing electrodes of the input sensing member ISP. In an embodiment, for example, the first insulating layer LRL may cover the first sensors SP1 of FIG. 6, to be further from the display panel DP than the sensing electrodes. FIGS. 7A to 7C omit the illustration of the first sensors SP1 (of FIG. 6) that are covered with the first insulating layer LRL.

Referring to FIG. 7A, a plurality of openings may be defined in the first insulating layer LRL. A sidewall of the first insulating layer LRL may define the plurality of openings. The plurality of openings in the first insulating layer LRL may be disposed corresponding to the plurality of emission openings in the pixel definition layer PDL (of FIG. 5). Each of the plurality of openings in the first insulating layer LRL may overlap (or be aligned with) a corresponding one of the plurality of emission openings in the pixel definition layer PDL (of FIG. 5). Each of the plurality of openings in the first insulating layer LRL may extend along a direction intersecting an extending direction of the overlapped emission opening. That is, each of the plurality of openings in the first insulating layer LRL may have a major dimension which extends along an extending direction (e.g., second extending direction) intersecting an extending direction of the overlapped emission opening (e.g., first extending direction).

The plurality of openings in the first insulating layer LRL may include a first opening group OP-1, a second opening group OP-2, and a third opening group OP-3. The first opening group OP-1 may be disposed corresponding to the first emission opening group OP-P1 of the pixel definition layer PDL (of FIG. 5), the second opening group OP-2 may be disposed corresponding to the second emission opening group OP-P2 of the pixel definition layer PDL (of FIG. 5), and the third opening group OP-3 may be disposed corresponding to the third emission opening group OP-P3 of the pixel definition layer PDL (of FIG. 5).

The first opening group OP-1 may include openings that correspondingly overlap the first emission regions PXA1, the second opening group OP-2 may include openings that correspondingly overlap the second emission regions PXA2, and the third opening group OP-3 may include openings that correspondingly overlap the third emission regions PXA3. In an embodiment, for example, a red light may be emitted through the openings of the first opening group OP-1, a blue light may be emitted through the openings of the second opening group OP-2, and a green light may be emitted through the openings of the third opening group OP-3.

The openings included in each of the first, second, and third opening groups OP-1, OP-2, and OP-3 may have planar areas based on planar areas of overlapped emission openings. In an embodiment, for example, when viewed in plan, the openings of the second opening group OP-2 that overlap the largest emission openings of the second emission opening group OP-P2 may each have an area that is greater than all the other openings of the first insulating layer LRL, and the openings of the third opening group OP-3 that overlap the smallest emission openings of the third emission opening group OP-P3 may each have an area that is less than all the other openings of the first insulating layer LRL. As the first insulating layer LRL is formed to include an opening whose area corresponds to that of an overlapped emission opening, the display module DM may effectively increase in emission efficiency.

Each of the first, second, and third opening groups OP-1, OP-2, and OP-3 may include a plurality of openings that extend in one direction. The first, second, and third opening groups OP-1, OP-2, and OP-3 may respectively include openings (referred to hereinafter as a first opening OP-L11, a third opening OP-L21, and a fifth opening OP-L31) that have a major dimension which extends along the second intersection direction DR2a, and may also respectively include openings (referred to hereinafter as a second opening OP-L12, a fourth opening OP-L22, and a sixth opening OP-L32) that have a major dimension which extends along the first intersection direction DR1a.

In an embodiment, for example, the first opening group OP-1 may include the first opening OP-L11 and the second opening OP-L12 that extend in different directions (e.g., different extending directions). The first and second openings OP-L11 and OP-L12 included in the first opening group OP-1 may have the same area.

The first opening OP-L11 of the first opening group OP-1 may have a first width D1 in the first intersection direction DR1a and a second width D2 in the second intersection direction DR2a. With regard to the first opening OP-L11 that extends along the second intersection direction DR2a, the second width D2 may be greater than the first width D1 to define a major dimension.

The first opening OP-L11 of the first opening group OP-1 may extend in a direction that intersects the extending direction of the first emission opening OP-P11 that overlaps the first opening OP-L11. In an embodiment, for example, the first opening OP-L11 that extends along the second intersection direction DR2a may overlap the first emission opening OP-P11 that extends along the first intersection direction DR1a. The first width D1 of the first opening OP-L11 in the first insulating layer LRL may be less than the first width W1 (of FIG. 5) of the first emission opening OP-P11 in the pixel definition layer PDL, and the second width D2 of the first opening OP-L11 in the first insulating layer LRL may be greater than the second width W2 (of FIG. 5) of the first emission opening OP-P11 in the pixel definition layer PDL. That is, in a same extending direction (e.g., a respective intersection direction), dimensions of corresponding emission and insulating layer openings may be different from each other.

The planar area of the first opening OP-L11 may be substantially the same as or greater than the planar area of the first emission opening OP-P11 that overlaps the first opening OP-L11. Where the dimensions of corresponding emission and insulating layer openings are different from each other, a portion of the first opening OP-L11 may overlap the first emission opening OP-P11 (e.g., first area), and a remaining portion of the first opening OP-L11 (e.g., second area or remaining area) may overlap the pixel definition layer PDL (of FIG. 5).

The second opening OP-L12 of the first opening group OP-1 may extend along the first intersection direction DR1a. The second opening OP-L12 may have a third width D3 in the first intersection direction DR1a and a fourth width D4 in the second intersection direction DR2a. With regard to the second opening OP-L12 that extends along the first intersection direction DR1a, the third width D3 may be greater than the fourth width D4.

The second opening OP-L12 that extends along the first intersection direction DR1a may overlap the second emission opening OP-P12 that extends along the second intersection direction DR2a. The third width D3 of the second opening OP-L12 may be greater than the third width W3 (of FIG. 5) of the second emission opening OP-P12, and the fourth width D4 of the second opening OP-L12 may be less than the fourth width W4 (of FIG. 5) of the second emission opening OP-P12. The area of the second opening OP-L12 may be substantially the same as or greater than that of the second emission opening OP-P12 that overlaps the second opening OP-L12.

Likewise, the second opening group OP-2 may include the third opening OP-L21 and the fourth opening OP-L22 whose areas are the same as each other and whose extending directions are different from each other, and the third opening group OP-3 may include the fifth opening OP-L31 and the sixth opening OP-L32 whose areas are the same as each other and whose extending directions are different from each other.

The third opening OP-L21 and the fourth opening OP-L22 of the second opening group OP-2 may respectively overlap the third emission opening OP-P21 and the fourth emission opening OP-P22 of the second emission opening group OP-P2. The third opening OP-L21 that extends along the second intersection direction DR2a may overlap the third emission opening OP-P21 that extends along the first intersection direction DR1a. The fourth opening OP-L22 that extends along the first intersection direction DR1a may overlap the fourth emission opening OP-P22 that extends along the second intersection direction DR2a.

The fifth opening OP-L31 and the sixth opening OP-L32 of the third opening group OP-3 may respectively overlap the fifth emission opening OP-P31 and the sixth emission opening OP-P32 of the third emission opening group OP-P3. The fifth opening OP-L31 that extends along the second intersection direction DR2a may overlap the fifth emission opening OP-P31 that extends along the first intersection direction DR1a. The sixth opening OP-L32 that extends along the first intersection direction DR1a may overlap the sixth emission opening OP-P32 that extends along the second intersection direction DR2a.

The first, second, and third opening groups OP-1, OP-2, and OP-3 may have shapes which correspond to those of overlapped emission openings. FIG. 7A shows by way of example that the first insulating layer LRL has a plurality of openings (e.g., insulating layer openings) with rectangular shapes that extend along one direction according to a major dimension thereof, and correspond to those of the emission openings. However, the invention is not limited thereto, and when the emission opening has a polygonal shape, the openings of the first insulating layer LRL may also have a polygonal shape that overlaps the emission opening. The shape of the openings of the first insulating layer LRL may be variously changed based on the shape of the overlapped emission opening. The planar shape of the openings of the first insulating layer LRL may correspond to the shape of the overlapped emission opening, without being limited thereto.

An arrangement of the openings included in the first, second, and third opening groups OP-1, OP-2, and OP-3 may correspond to an arrangement of the emission openings included in the first, second, and third emission opening groups OP-P1, OP-P2, and OP-P3.

The openings of the first opening group OP-1 and the second opening group OP-2 may overlap the emission openings of the first emission opening group OP-P1 and the second emission opening group OP-P2, respectively, and may be alternately arranged along the first direction DR1 and the second direction DR2. The openings of the third opening group OP-3 may correspondingly overlap the emission openings of the third emission opening group OP-P3 and may be arranged consecutively along the first direction DR1 and the second direction DR2.

The openings of the first and second opening groups OP-1 and OP-2 may be staggeringly arranged in the first direction DR1 with the openings of the third opening group OP-3. Ones of the openings included in the third opening group OP-3 and the openings of the first opening group OP-1 may be arranged along the first intersection direction DR1a, and remaining ones of the openings included in the third opening group OP-3 and the openings of the second opening group OP-2 may be arranged along the first intersection direction DR1a.

As the emission opening of the pixel definition layer PDL (of FIG. 5) is disposed overlapping the opening of the first insulating layer LRL, it may be possible to increase emission efficiency of light emitted through the emission opening. While the first insulating layer LRL is formed on the display panel DP, process errors may occur, and accordingly, accuracy of alignment between the emission opening of the pixel definition layer PDL and the opening of the first insulating layer LRL may be reduced. The emission opening may be formed to have a shape that extends in one direction, and the opening of the first insulating layer LRL may be formed to overlap the emission opening and to have a shape that extends along a direction intersecting the extending direction of the emission opening, with the result that the display module DM may have a structure that is stable against process variation. In an embodiment, for example, the display module DM according to an embodiment of the invention is designed in consideration of parameters that produce process errors, and may thus increase in reliability and emission efficiency.

The embodiments of the display module DM shown in FIGS. 7B and 7C may include substantially the same configuration of that of the display module DM illustrated in FIG. 7A, and the description of the display module DM depicted in FIG. 7A may be identically applicable to the display module DM demonstrated in FIGS. 7B and 7C. The embodiments of the display module DM shown in FIGS. 7B and 7C may to some extent differ from the embodiment of the display module DM illustrate in FIG. 7A in that an arrangement of the emission openings and an arrangement of the openings, and the following will discuss differences therebetween.

The emission openings of the first emission opening group OP-P1 and the emission openings of the second emission opening group OP-P2 may be alternately arranged along the first direction DR1 and the second direction DR2. As shown in FIG. 7A, the first emission opening OP-P11 that extends along the first intersection direction DR1a may be alternately arranged along the first direction DR1 with the third emission opening OP-P21 that extends along the first intersection direction DR1a, and may be alternately arranged along the second direction DR2 with the fourth emission opening OP-P22 that extends along the second intersection direction DR2a.

However, the invention is not limited thereto, and as shown in FIG. 7B, the first emission opening OP-P11 that extend along the first intersection direction DR1a may be arranged along the second direction DR2 with the third emission opening OP-P21 that extends along the first intersection direction DR1a, and may be arranged along the first direction DR1 with the fourth emission opening OP-P22 that extends along the second intersection direction DR2a.

The first opening OP-L11 that extends along the second intersection direction DR2a may overlap the first emission opening OP-P11 that extends along the first intersection direction DR1a. The third opening OP-L21 that extends along the second intersection direction DR2a may overlap the third emission opening OP-P21 that extends along the first intersection direction DR1a. The fourth opening OP-L22 that extends along the first intersection direction DR1a may overlap the fourth emission opening OP-P22 that extends along the second intersection direction DR2a.

The first opening group OP-1 and the second opening group OP-2 may have arrangements depending on those of the first emission opening group OP-P1 and the second emission opening group OP-P2, respectively. Referring to FIG. 7B, the first opening OP-L11 may be arranged along the first direction DR1 with the fourth opening OP-L22, and along the second direction DR2 with the third opening OP-L21.

The third emission opening group OP-P3 may have emission openings that are arranged along the first direction DR1 and the second direction DR2. As shown in FIG. 7A, the fifth and sixth emission openings OP-P31 and OP-P32 included in the third emission opening group OP-P3 may extend in different directions and may be alternately arranged along the first direction DR1 and the second direction DR2. In an embodiment, for example, the fifth emission openings OP-P31 that extend along the first intersection direction DR1a may be alternately arranged along the first and second directions DR1 and DR2, with the sixth emission openings OP-P32 that extend along the second intersection direction DR2a, among emission openings adjacent to each other within the third emission opening group OP-P3. The fifth emission openings OP-P31 that extend along the first intersection direction DR1a may be arranged along the first intersection direction DR1a with the emission opening of the first emission opening group OP-P1 interposed therebetween.

However, the invention is not limited thereto, and as shown in FIG. 7C, the fifth and sixth emission openings OP-P31 and OP-P32 that extend in different directions may be arranged along the first intersection direction DR1a and the second intersection direction DR2a. The fifth emission openings OP-P31 that extend along the first intersection direction DR1a may be arranged along the second direction DR2. Likewise, the sixth emission openings OP-P32 that extend along the second intersection direction DR2a may be arranged along the second direction DR2. The fifth emission openings OP-P31 arranged along the second direction DR2 may be respectively arranged side by side (e.g., adjacent to each other) along the first direction DR1 with the sixth emission openings OP-P32 arranged along the second direction DR2.

The fifth opening OP-L31 that extends along the second intersection direction DR2a may overlap the fifth emission opening OP-P31 that extends along the first intersection direction DR1a, and the sixth opening OP-L32 that extends along the first intersection direction DR1a may overlap the sixth emission opening OP-P32 that extends along the second intersection direction DR2a.

The third opening group OP-3 may have an arrangement depending on that of the third emission opening group OP-P3. Referring to FIG. 7C, the fifth openings OP-L31 may be arranged along the second direction DR2 while correspondingly overlapping the fifth emission openings OP-P31. Likewise, the sixth openings OP-L32 may be arranged along the second direction DR2 while correspondingly overlapping the sixth emission openings OP-P32. The fifth openings OP-L31 and the sixth openings OP-L32 may be arranged side by side along the first direction DR1.

FIGS. 7A to 7C show by way of example arrangements and shapes of the emission openings and the openings, but the emission openings and the openings (e.g., insulating layer openings) may be variously arranged and shaped without being limited to those shown in FIGS. 7A to 7C.

Figure 9A:
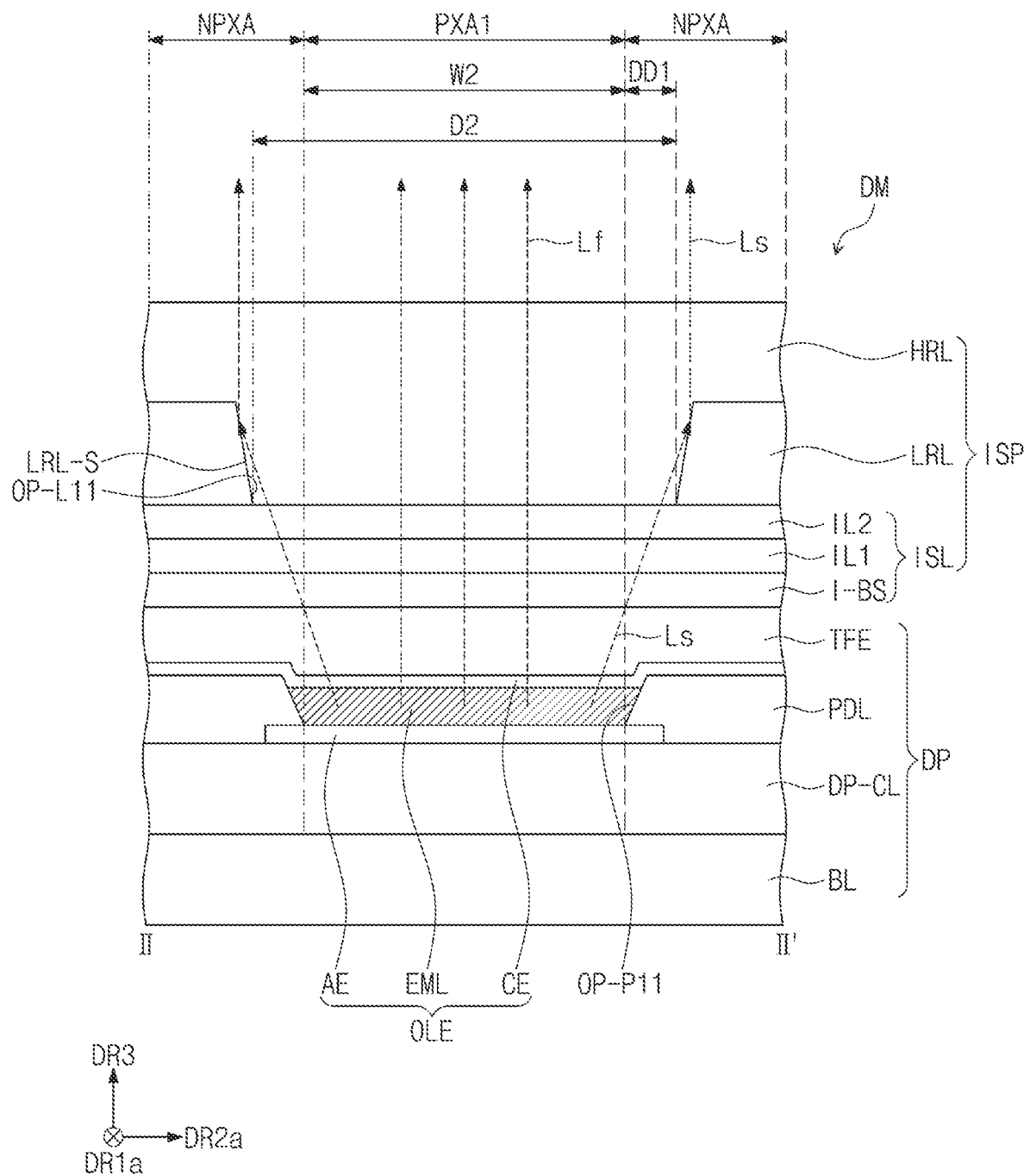
FIG. 9A illustrates a cross-sectional view taken along line II-IF of FIG. 8, showing a display module according to an embodiment of the invention.
Figure 9B:
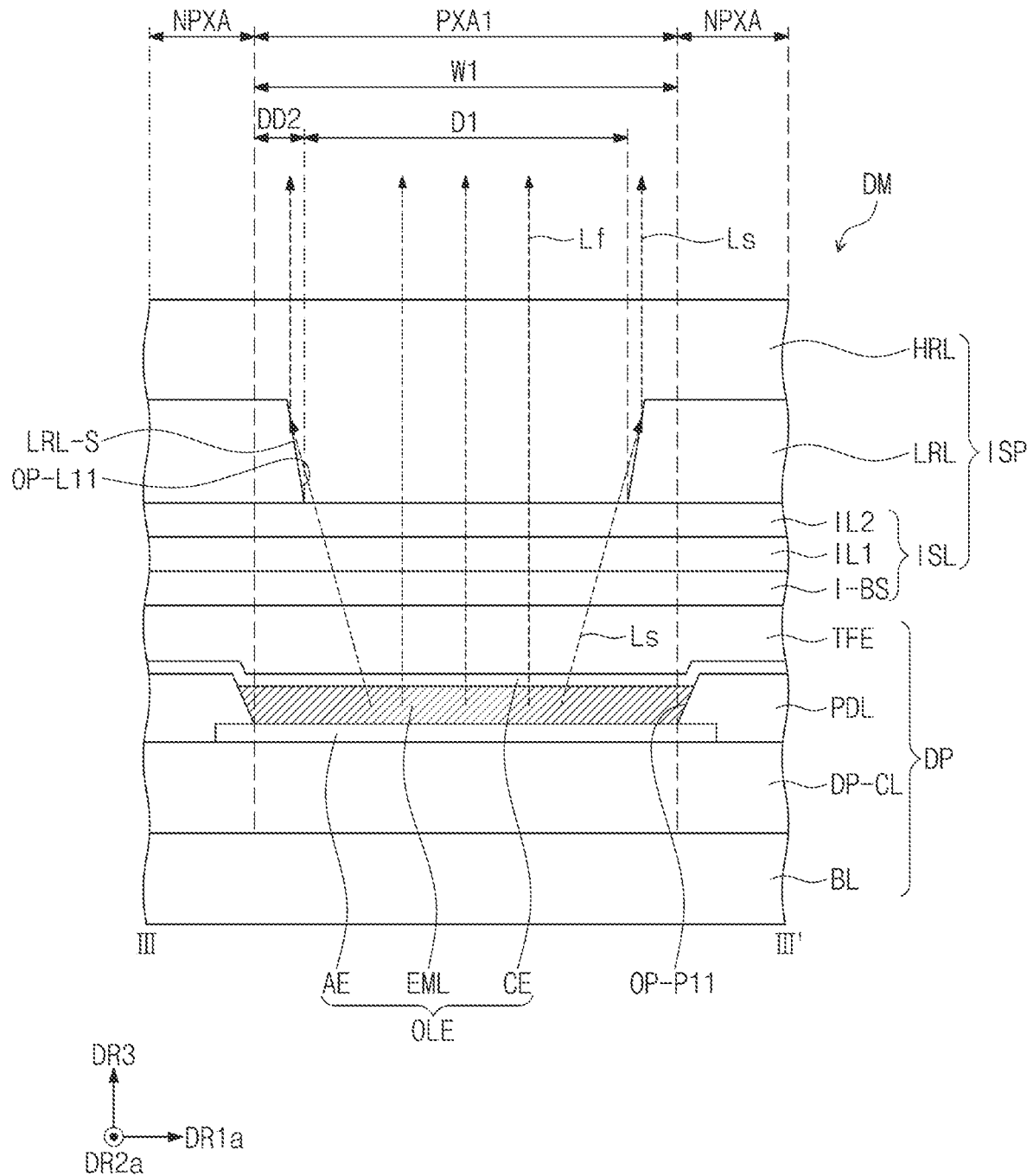
FIG. 9B illustrates a cross-sectional view taken along line of FIG. 8, showing a display module according to an embodiment of the invention.

FIG. 8 illustrates an enlarged plan view showing a display module DM that corresponds to one of a plurality of emission openings depicted in FIG. 7A. FIG. 9A illustrates a cross-sectional view showing a display module DM taken along line II-IF of FIG. 8. FIG. 9B illustrates a cross-sectional view showing a display module DM taken along line of FIG. 8.

FIG. 8 shows a plan view showing the first emission opening OP-P11 among the emission openings illustrated in FIG. 7A and showing the first opening OP-L11 (e.g., first insulating layer opening) among the first insulating layer LRL which overlaps the first emission opening OP-P11. The following description may be identically applicable to other emission openings and other insulating layer openings.

Referring to FIG. 8, when viewed in plan, the first emission opening OP-P11 of the pixel definition layer PDL (of FIG. 5) may extend along the first intersection direction DR1a and may overlap the first opening OP-L11 of the first insulating layer LRL, where the first opening OP-L11 extends along the second intersection direction DR2a. The first opening OP-L11 may have an area (e.g., planar area) substantially the same as or greater than that of the first emission opening OP-PH.

When viewed in plan, a portion of the first emission opening OP-P11 may overlap the first opening OP-L11 and a remaining portion of the first emission opening OP-P11 may overlap the first insulating layer LRL. In an embodiment, for example, a portion of the first emission region PXA1 may overlap the first opening OP-L11, and a remaining portion of the first emission region PXA1 may overlap the first insulating layer LRL. As an emission region overlaps an opening of an insulating layer, it may be possible to increase emission efficiency of light emitted through the emission region.

As discussed with reference to FIG. 5, when viewed in plan, the first emission opening OP-P11 may have a first width W1 in the first intersection direction DR1a and a second width W2 in the second intersection direction DR2a. As discussed with reference to FIG. 7A, when viewed in plan, the first opening OP-L11 may have a first width D1 in the first intersection direction DR1a and a second width D2 in the second intersection direction DR2a.

The first width W1 of the first emission opening OP-P11 extending along the first intersection direction DR1a may be greater than the first width D1 of the first opening OP-L11 along the first intersection direction DR1a. The second width W2 of the first emission opening OP-P11 in the second intersection direction DR2a may be less than the second width D2 of first opening OP-L11 extending along the second intersection direction DR2a.

The first emission opening OP-P11 may include a first side S1 that extends along the first intersection direction DR1a and a second side S2 that extends along the second intersection direction DR2a. The first side S1 may have a length that corresponds to the first width W1 of the first emission opening OP-P11, and the second side S2 may have a length that corresponds to the second width W2 of the first emission opening OP-P11.

A slight difference in an interval between opposing sides may be provided between the first emission opening OP-P11 and the first opening OP-L11 that overlap each other when viewed in plan. The first opening OP-L11 may be opened more than the first emission opening OP-P11 by spacings on opposite sides in the second intersection direction DR2a. In an embodiment, for example, when viewed in plan, there may be a first interval DD1 in the second intersection direction DR2a between the first side S1 of the first emission opening OP-P11 and a third side L1 of the first opening OP-L11, where the third side L1 is adjacent to (e.g., closest to or corresponds to) the first side S1.

The first emission opening OP-P11 may be opened more than the first opening OP-L11 by spacings on opposite sides in the first intersection direction DR1a. In an embodiment, for example, when viewed in plan, there may be a second interval DD2 in the first intersection direction DR1a between the second side S2 of the first emission opening OP-P11 and a fourth side L4 of the first opening OP-L11, where the fourth side L4 is adjacent to the second side S2.

A reduction in the first and second intervals DD1 and DD2 may induce an effective increase in emission efficiency, and an increase in the first and second intervals DD1 and DD2 may induce a reduction in the degree of increase in emission efficiency. The first interval DD1 and the second interval DD2 may be designed to be within a range in consideration of parameters that produce process errors in fabricating the display device DD. In an embodiment, for example, the first interval DD1 and the second interval DD2 may each be equal to or less than about 2 micrometers (μm). In an embodiment, a minimum interval between a respective first side of the pixel definition layer PDL (e.g., sides S1 or S2) and a corresponding second side of the first insulating layer LRL (e.g., sides L1 or L2) is equal to or less than about 2 μm. However, the value of the first and second intervals DD1 and DD2 is not limited to the example above. The first interval DD1 and the second interval DD2 may be adjusted such that the display device DD may be fabricated to have a structure robust to process variation and to have increased emission efficiency and reliability.

Referring to FIGS. 9A and 9B, the display module DM according to an embodiment may include a display panel DP and an input sensing member ISP. The display panel DP may include a base layer BL, a circuit element layer DP-CL, a light emitting element OLE, a pixel definition layer PDL, and an encapsulation layer TFE. The input sensing member ISP may include an input sensing layer ISL, a first insulating layer LRL, and a second insulating layer HRL.

The display panel DP may include a plurality of insulating layers, a semiconductor pattern, a conductive pattern, and a signal line. In fabricating the display panel DP, processes such as coating and deposition may be performed to form an insulating layer, a semiconductor layer, and a conductive layer on the base layer BL. Afterwards, a photolithography process may selectively pattern the insulating layer, the semiconductor layer, and the conductive layer. Therefore, there may be formed the semiconductor pattern, the conductive pattern, and the signal line included in the circuit element layer DP-CL and the light emitting element OLE.

The semiconductor pattern may be specifically arranged over pixels PX. Each of the pixels may have an equivalent circuit that includes transistors, at least one capacitor, and a light emitting element, and the equivalent circuit of the pixel PX may be variously changed.

The base layer BL may provide a base surface on which the circuit element layer DP-CL is disposed. The base layer BL may include a glass substrate, a metal substrate, a polymer substrate, or an organic/inorganic composite material substrate.

The base layer BL may have a multi-layered structure. In an embodiment, for example, the base layer BL may have a structure that includes synthetic resin layers and at least one inorganic layer disposed between the synthetic resin layers. In an embodiment, for example, the synthetic resin layer may include one or more of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, the material of the base layer BL is not limited to the example above.

At least one inorganic layer may be disposed on a top surface of the base layer BL. The inorganic layers may constitute a barrier layer and/or a buffer layer. The inorganic layer disposed on the top surface of the base layer BL may increase an adhesive force between the base layer BL and the semiconductor pattern of the circuit element layer DP-CL. In an embodiment, for example, the inorganic layer may include one or more of aluminum oxide, titanium oxide, silicon oxide, silicon nitride, silicon oxynitride, zirconium oxide, and hafnium oxide.

The circuit element layer DP-CL may be disposed on the base layer BL. The circuit element layer DP-CL may include at least one insulating layer and a circuit element. The insulating layer included in the circuit element layer DP-CL may be called an intermediate insulating layer. The circuit element layer DP-CL may include the driver circuit GDC, the signal lines SGL, the pixel pads D-PD and the input pad I-PD of FIG. 3. The pixel pads D-PD and the input pads I-PD may be provided by exposing portions of lines disposed in the circuit element layer DP-CL from the intermediate insulating layer of the circuit element layer DP-CL, to outside the display panel DP.

When viewed in plan, the semiconductor pattern included in the circuit element layer DP-CL may be specifically arranged overlapping the emission regions. The semiconductor pattern may include polysilicon, amorphous silicon, or metal oxide.

The semiconductor pattern according to an embodiment may have electrical properties that are different whether or not the semiconductor pattern is doped or reduced. The semiconductor pattern may include a first region whose conductivity is high and a second region whose conductivity is low.

In an embodiment, for example, the first region may be doped with n-type or p-type impurities (e.g., n-type or p-type dopants). A p-type transistor may include a doped region implanted with p-type impurities, and an n-type transistor may include a doped region implanted with n-type impurities. The second region may be an undoped region or may be a doped region implanted with impurities whose concentration is lower than that of impurities doped in the first region.

The invention, however, is not limited thereto, and the first region may be zone where metal oxide is reduced and the second region may be a zone where metal oxide is not reduced.

The first region may have conductivity greater than that of the second region, and may substantially serve as an electrode or a signal line. The second region may substantially correspond to an active section (or channel section) of a transistor. In an embodiment, for example, a portion of the semiconductor pattern may be an active section of a transistor, and another portion of the semiconductor pattern may be a source section or a drain section.

The light emitting element OLE may be disposed on the circuit element layer DP-CL. The light emitting element OLE may include a first electrode AE, an emission layer EML, and a second electrode CE. The invention, however, is not limited thereto, and the light emitting element OLE may further include a hole control layer HCL and an electron control layer ECL.

The first electrode AE may be disposed on the circuit element layer DP-CL. The first electrode AE may be electrically connected to the circuit element layer DP-CL through a contact hole that is defined in (or by) the intermediate insulating layer of the circuit element layer DP-CL.

The pixel definition layer PDL may be formed on the first electrode AE. As discussed above, a plurality of emission openings may be defined in the pixel definition layer PDL, and the following description will focus on the first emission opening OP-P11 shown in FIG. 9A. The following description may be identically applicable to other emission openings.

The first emission opening OP-P11 of the pixel definition layer PDL may expose a portion of the first electrode AE to outside the pixel definition layer PDL. The pixel definition layer PDL may cover a remaining portion of the first electrode AE other than the portion of the first electrode AE which is exposed by the first emission opening OP-P11. When viewed in plan, emission regions may correspond to portions of the first electrodes AE that are exposed by emission openings of the pixel definition layer PDL. Referring to FIGS. 9A and 9B, an area of the first electrode AE exposed to the first emission opening OP-P11 may correspond to the first emission region PXA1.

The pixel definition layer PDL may include an organic material. The pixel definition layer PDL according to an embodiment may have a black color. In an embodiment, for example, the pixel definition layer PDL may include a base resin and may also include a black pigment and/or a black dye mixed in the base resin.

The emission layer EML may be disposed on the first electrode AE. The emission layer EML may be disposed on the first emission opening OP-P11 of the pixel definition layer PDL. The emission layer EML may include an organic light emitting material, an inorganic light emitting material, a quantum dot, or a quantum rod.

The emission layer EML may be formed into a plurality of pieces that respectively correspond to a plurality of emission regions (e.g., emission layer patterns). The separately formed pieces of the emission layer EML may emit at least one selected from a red light, a green light, and a blue light. This invention, however, is not limited thereto, and the emission layer EML may be formed in common on a plurality of emission regions and may emit a blue light or a white light. Alternatively, the emission layer EML may have a multi-layered structure that is called a tandem structure.

The second electrode CE may be disposed on the emission layer EML. The second electrode CE may be disposed in common on emission regions (e.g., the first emission region PXA1 of FIG. 9A) and the non-emission region NPXA. The second electrode CE may be supplied with a common voltage and may be called a common electrode.

The encapsulation layer TFE may be disposed on the second electrode CE. The encapsulation layer TFE may include an inorganic layer and an organic layer. In an embodiment, for example, the encapsulation layer TFE may include a plurality of inorganic layers and an organic layer which is disposed between the inorganic layers, but the encapsulation layer TFE is not limited to the configuration mentioned above.

The inorganic layer may protect the light emitting element OLE against moisture and/or oxygen. In an embodiment, for example, the inorganic layer may include a silicon nitride layer, a silicon oxynitride layer, a silicon oxide layer, a titanium oxide layer, or an aluminum oxide layer, and the invention is not limited thereto. The organic layer may protect the light emitting element OLE against foreign substances such as dust particles. The organic layer may include an acryl-based organic layer, and the invention is not limited thereto.

The input sensing layer ISL may be disposed on the display panel DP. In an embodiment, for example, the input sensing layer ISL may be directly disposed on the display panel DP. The input sensing layer ISL may include a plurality of conductive layers and a plurality of touch insulating layers. The plurality of conductive layers included in the input sensing layer ISL may constitute the sensing electrodes and the sensing signal lines of FIG. 4. The plurality of conductive layers may include a first conductive layer and a second conductive layer. The plurality of touch insulating layers may include a base insulating layer I-BS, a first touch insulating layer IL1, and a second touch insulating layer IL2.

The base insulating layer I-BS may be disposed on the encapsulation layer TFE. The base insulating layer I-BS may include an inorganic material. In an embodiment, for example, the base insulating layer I-BS may include silicon nitride. The base insulating layer I-BS and an uppermost inorganic layer of the encapsulation layer TFE may each include silicon nitride, but may be formed under different deposition conditions.

The first touch insulating layer IL1 may be disposed on the base insulating layer I-BS. The first touch insulating layer IL1 may include the same material as that of the base insulating layer I-BS. The first touch insulating layer IL1 may have a thickness less than that of the base insulating layer I-BS. In an embodiment, the first touch insulating layer IL1 may be omitted.

The first conductive layer may be disposed on the first touch insulating layer IL1. The first conductive layer may include the first connector CP1 of FIG. 4. The invention, however, is not limited thereto, and the first conductive layer may include the second connector CP2 and the first and second sensors SP1 and SP2 of FIG. 4.

The first touch insulating layer IL1 may be provided thereon with the second touch insulating layer IL2 that covers the first conductive layer. The second conductive layer may be disposed on the second touch insulating layer IL2. The second conductive layer may include the first sensor SP1, the second sensor SP2, and the second connector CP2 of FIG. 4. The invention, however, is not limited thereto, and the second conductive layer may include the first connector CP1 of FIG. 4.

The second touch insulating layer IL2 may include the same material as that of the base insulating layer I-BS. The second touch insulating layer IL2 may have a thickness less than that of the base insulating layer I-BS. The second touch insulating layer IL2 may separate the first and second conductive layers from each other when viewed in cross-section. The second touch insulating layer IL2 may be provided therein with a contact hole that is defined to expose a portion of the first conductive layer, to outside the second touch insulating layer IL2. This will be discussed below with reference to FIG. 11.

The first insulating layer LRL may be disposed on the input sensing layer ISL. In an embodiment, for example, the first insulating layer LRL may be directly disposed on the input sensing layer ISL. The first insulating layer LRL may cover the second conductive layer and the second touch insulating layer IL2 of the input sensing layer ISL.

As discussed below, the first insulating layer LRL may have a plurality of openings (e.g., insulating layer openings) that are defined to overlap (or respectively correspond to) a plurality of emission openings. FIG. 9A shows by way of example a cross-section of the first opening OP-L11 that corresponds to the first emission opening OP-P11.

The second insulating layer HRL may be disposed on the first insulating layer LRL. In an embodiment, for example, the second insulating layer HRL may be directly disposed on the first insulating layer LRL. The second insulating layer HRL may be disposed overlapping emission regions (e.g., the first emission region PXA1 of FIG. 9A) and the non-emission region NPXA. The second insulating layer HRL may cover a top surface of the first insulating layer LRL and insides of openings in the first insulating layer LRL.

The first opening OP-L11 in the first insulating layer LRL may be defined by an inclined surface LRL-S of the first insulating layer LRL (e.g., inclined sidewall). The inclined surface LRL-S may have a shape slanted to a top surface of the second touch insulating layer IL2 which is furthest from the display panel DP. The second insulating layer HRL may cover the inclined surface LRL-S of the first insulating layer LRL. A dimension (e.g., width or length) along the display panel DP, of the first opening OP-L11, may increase in a direction away from the display panel DP. That is, a maximum dimension of the first opening OP-L11 may be defined at a top surface of the first insulating layer LRL which is furthest from the display panel DP.

Each of the first and second insulating layers LRL and HRL may have a refractive index. The refractive index of the second insulating layer HRL may be greater than that of the first insulating layer LRL. Therefore, a total reflection may occur at an interface between the first insulating layer LRL and the second insulating layer HRL.

The light emitting element OLE may emit light in a front direction (e.g., along a third direction) and a lateral direction. The light emitted in the front direction may increase emission efficiency of the display device DD. For convenience of description, FIGS. 9A and 9B show by way of example simplified optical paths of a front surface light Lf emitted in the front direction from the light emitting element OLE, and a lateral surface light Ls emitted in the lateral direction from the light emitting element OLE. This, however, is merely an example, and the optical path is not limited to that shown.

According to an embodiment of the invention, the front surface light Lf emitted in the front direction from the light emitting element OLE may pass through the second insulating layer HRL and may then be output to outside the display module DM. A portion of the lateral surface light Ls emitted in the lateral direction from the light emitting element OLE may be incident on the inclined surface LRL-S or the interface between the first insulating layer LRL and the second insulating layer HRL. The portion of the lateral surface light Ls incident on the inclined surface LRL-S of the first insulating layer LRL may be totally reflected or refracted due to a difference in refractive index between the first insulating layer LRL and the second insulating layer HRL. The lateral surface light Ls that is totally reflected may have an optical path directed toward the front direction. As such, the optical path of the lateral surface light Ls may be changed toward the front direction, and thus the display device DD may increase in emission efficiency.

The first insulating layer LRL may have a refractive index of about 1.3 to about 1.6. In an embodiment, for example, the refractive index of the first insulating layer LRL may range from about 1.4 to about 1.55. The first insulating layer LRL may include an acryl-based organic material whose refractive index is equal to or greater than about 1.5. In an embodiment, for example, the first insulating layer LRL may include one or more of ethylhexyl acrylate, pentafluoropropyl acrylate, poly(ethyleneglycol) dimethacrylate, and ethylene glycol dimethacrylate. However, the material of the first insulating layer LRL is not limited to the example above.

The second insulating layer HRL may have a refractive index of about 1.6 to about 1.9. In an embodiment, for example, the refractive index of the second insulating layer HRL may range from about 1.65 to about 1.85. The second insulating layer HRL may include an acryl-based or siloxane-based organic material whose refractive index of about 1.6. In an embodiment, for example, the second insulating layer HRL may include one or more of methyltrimethoxysilane, tetramethoxysilane, and polydiarylsiloxane. However, the material of the second insulating layer HRL is not limited to the example above.

In an embodiment, the second insulating layer HRL may further include distributed particles to have a relatively higher refractive index. In an embodiment, for example, the second insulating layer HRL may further include metal oxide particles such as zinc oxide ($ZnO_x$), titanium oxide ($TiO_2$), or zirconium oxide ($ZrO_2$).

There may be a difference in width between the first opening OP-L11 and the first emission opening OP-P11. Referring to FIG. 9A, when viewed in cross-section in the first intersection direction DR1a, the second width D2 in the second intersection direction DR2a of the first opening OP-L11 may be greater than the second width W2 of the first emission opening OP-P11. Referring to FIG. 9B, when viewed in cross-section in the second intersection direction DR2a, the first width D1 in the first intersection direction DR1a of the first opening OP-L11 may be less than the first width W1 of the first emission opening OP-P11.

The first opening OP-L11 may be opened to a maximum width in one direction greater than a maximum width of the first emission region PXA1, and may be opened to a maximum width in another direction less than a maximum width the first emission region PXA1. A width difference (e.g., the first interval DD1 and the second interval DD2) between an emission opening of a pixel definition layer and a corresponding overlapped opening of an insulating layer may be adjusted to have a value, and thus it may be possible to increase emission efficiency of the display device DD and also to provide the display device DD with robustness to process variation and with improved reliability.

Figure 11:
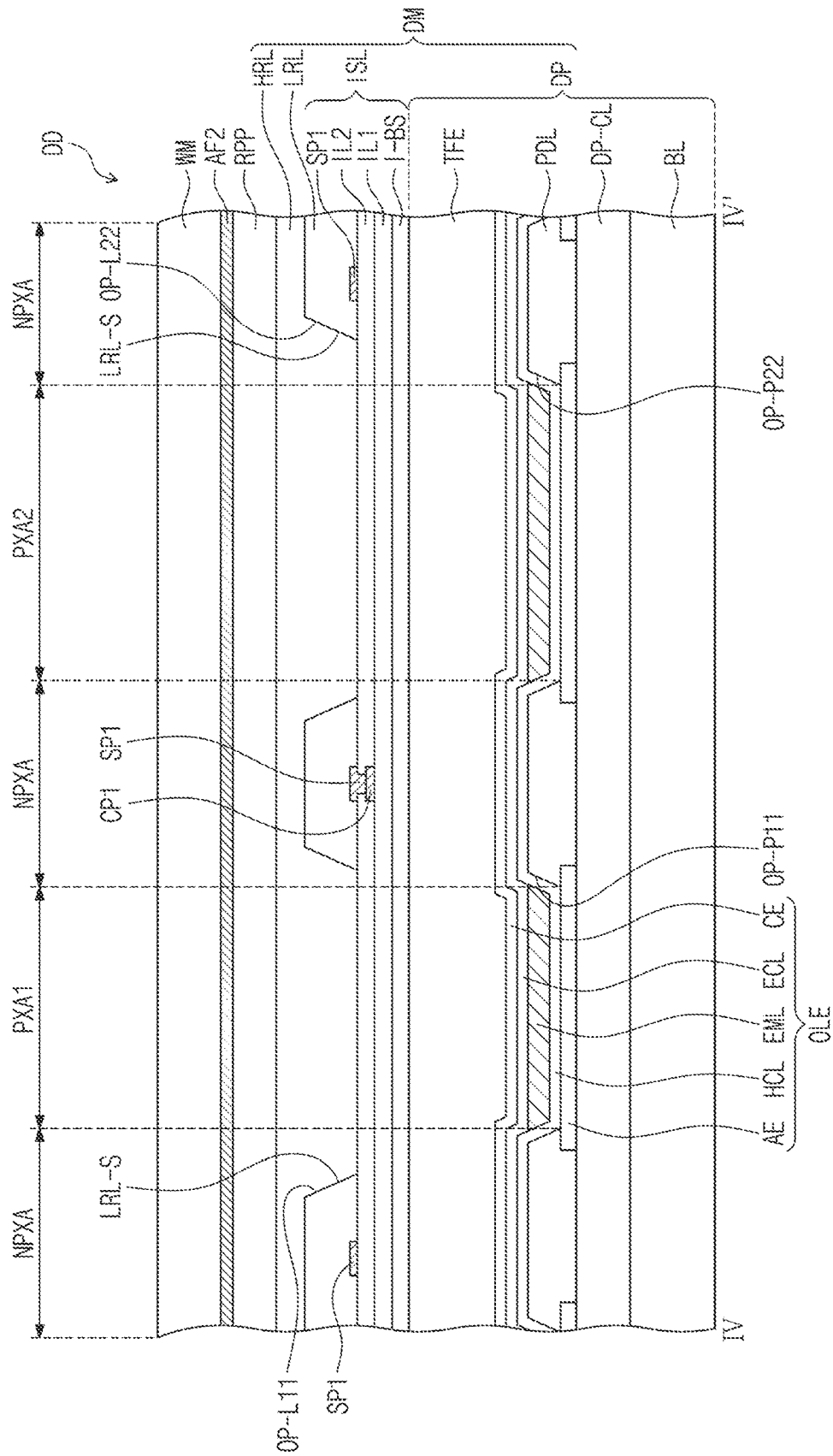
FIG. 11 illustrates a cross-sectional view taken along line IV-IV' of FIG. 10, showing a display device according to an embodiment of the invention.

FIG. 10 illustrates an enlarged plan view showing a display module DM according to an embodiment. FIG. 11 illustrates a cross-sectional view taken along line IV-IV' of FIG. 10, showing a display device DD according to an embodiment.

FIG. 10 shows a plan view of the display module DM on an area greater than that of the plan view of the display module DM according to an embodiment shown in FIG. 7A. The description mentioned above may be identically applicable to an arrangement and shape of emission openings and of insulating layer openings depicted in FIG. 10.

Referring to FIG. 10, the first, second, and third opening groups OP-1, OP-2, and OP-3 and the first, second, and third emission opening groups OP-P1, OP-P2, and OP-P3 may each be provided in plural, and the plural of groups may be variously arranged. In an embodiment, for example, the first, second, and third opening groups OP-1, OP-2, and OP-3 depicted in FIG. 7A may each be provided in plural, and the plural of the first, second, and third opening groups OP-1, OP-2, and OP-3 may be arranged along the first direction DR1 and the second direction DR2.

Openings of the first opening groups OP-1 may be alternately arranged along the first and second directions DR1 and DR2 with openings of the second opening groups OP-2. Openings of the third opening groups OP-3 may be arranged along the first and second directions DR1 and DR2. The openings of the first opening groups OP-1 and the openings of the second opening groups OP-2 may be staggeringly arranged in the first and second directions DR1 and DR2, together with the openings of the third opening groups OP-3.

The openings of the third opening groups OP-3 may be alternately arranged along the first and second intersection directions DR1a and DR2a with either the openings of the first opening groups OP-1 or the openings of the second opening groups OP-2. In an embodiment, for example, the fifth openings OP-L31 of the third opening groups OP-3 may be arranged along the first intersection direction DR1a with the first openings OP-L11 or the second openings OP-L12 of the first opening groups OP-1 interposed therebetween. The sixth openings OP-L32 of the third opening groups OP-3 may be arranged along the first intersection direction DR1a with the third openings OP-L21 or the fourth openings OP-L22 of the second opening groups OP-2 interposed therebetween.

The display module DM included in the display device DD shown in FIG. 11 may be configured substantially identically to the display module DM illustrated in FIG. 9A, and the description of the display module DM illustrated in FIG. 9A may be identically applicable to the display module DM shown in FIG. 11. Although FIG. 9A shows by way of example a cross-section of the display module DM that corresponds to one of the first emission opening OP-P11, FIG. 11 shows a cross-section of the display device DD that corresponds to two emission openings (e.g., the first emission opening OP-P11 and the fourth emission opening OP-P22). The following will focus on an example configured to include the first emission opening OP-P11 and the fourth emission opening OP-P22.

Referring to FIG. 11, the display device DD according to an embodiment may include a display module DM, an anti-reflection member RPP, a second adhesion layer AF2, and a window WM. The anti-reflection member RPP, the second adhesion layer AF2, and the window WM may be sequentially disposed in order from an input sensing member ISP of the display module DM. The description with reference to FIG. 2B may be identically applicable to the anti-reflection member RPP, the second adhesion layer AF2, and the window WM.

FIG. 11 shows by way of example an input sensing layer ISL that includes a first conductive layer including the first connector CP1 and a second conductive layer including the first sensor SP1. A portion of the first connector CP1 may be exposed at a contact hole defined in the second touch insulating layer IL2 to outside thereof, and the first sensor SP1 disposed on the second touch insulating layer IL2 may be connected to the first connector CP1 through the contact hole. The first sensor SP1 and the first connector CP1 that are electrically connected to each other may constitute the first sensing electrode mentioned above. The second conductive layer of the input sensing layer ISL may be covered with the first insulating layer LRL.

The light emitting elements OLE may be disposed correspondingly to emission openings of the pixel definition layer PDL. Referring to FIG. 11, the light emitting elements OLE may be disposed correspondingly to the first emission opening OP-P11 and the fourth emission opening OP-P22 of the pixel definition layer PDL.

The second electrode CE of the light emitting elements OLE may be integrally formed into a single unitary shape, and may be disposed in common on a plurality of emission regions (e.g., the first and second emission regions PXA1 and PXA2 of FIG. 11) and on the non-emission region NPXA.

The light emitting element OLE may further include a hole control layer HCL and an electron control layer ECL. Each of the hole control layer HCL and the electron control layer ECL may be disposed in common on a plurality of emission regions PXA1 and PXA2 and on the non-emission region NPXA.

The hole control layer HCL may be disposed on the first electrode AE. The hole control layer HCL may include a hole transport layer and a hole injection layer. The emission layer EML may be disposed on the hole control layer HCL. The electron control layer ECL may be disposed on the emission layer EML. The electron control layer ECL may include an electron transport layer and an electron injection layer.

Each of the first emission opening OP-P11 and the fourth emission opening OP-P22 may expose a portion of the first electrode AE to outside the pixel definition layer PDL. An area of the first electrode AE exposed at the first emission opening OP-P11 may correspond to the first emission region PXA1, and an area of the first electrode AE exposed at the fourth emission opening OP-P22 may correspond to the second emission region PXA2.

The light emitting element OLE disposed on the first emission opening OP-P11 may emit light whose color is different from that of light emitted from the light emitting element OLE disposed on the fourth emission opening OP-P22. The invention, however, is not limited thereto.

The first opening OP-L11 of the first insulating layer LRL may overlap the first emission opening OP-P11, and the fourth opening OP-L22 of the first insulating layer LRL may overlap the fourth emission opening OP-P22. A portion of lateral surface light Ls emitted from the light emitting element OLE disposed corresponding to the first emission region PXA1 may be incident on the inclined surface LRL-S in the first opening OP-L11 and may then be totally reflected. A portion of lateral surface light Ls emitted from the light emitting element OLE disposed corresponding to the second emission region PXA2 may be incident on the inclined surface LRL-S in the fourth opening OP-L22 and may then be totally reflected. The totally reflected lateral surface light may be directed in a front direction, and therefore the light emitting elements OLE may increase in emission efficiency.

A display device DD according to one or more embodiment of the invention may include a pixel definition layer PDL in which are defined a plurality of emission openings that define a plurality of emission regions, and may include an insulating layer which is disposed on the pixel definition layer PDL and in which a plurality of openings are defined. The plurality of openings of the insulating layer may overlap correspondingly to the plurality of emission openings of the pixel definition layer PDL, and thus it may be possible to increase emission efficiency of light emitted from the emission region.

The emission opening according to one or more embodiment of the invention may have a planar shape having a major dimension that extends along one direction (e.g., an extending direction), and the opening of the insulating layer that overlaps the emission opening may have a planar shape having a major dimension that extends in a direction that intersects the extending direction of the emission opening. Therefore, one or more embodiment of the display device DD may have a structure that is robust to process variation and is stable against parameters causing process errors, which may result in an increase in reliability and light emission efficiency of the display device DD.

Since one or more embodiment of the invention includes the insulating layer in which the openings are defined to correspond to the emission regions, light emitted in a lateral direction may be reflected into a front direction and thus the display device DD may increase in light emission efficiency.

In one or more embodiment of the invention, the emission openings that together form the emission region may be formed to have a major dimension which extends in one direction (e.g., an extending direction), and the openings of the insulating layer may be formed to extend in a direction intersecting the extending direction of the emission opening, and therefore the display device DD may have stability against process variation and may avoid reliability reduction caused by process errors.

Although embodiments have been described with reference to a number of illustrative examples thereof, it will be understood by those of ordinary skill in the art that various changes in form and details may be made without departing from the spirit and scope of the invention as set forth in the following claims.

Thus, the technical scope of the invention is not limited by the embodiments and examples described above, but by the following claims.

What is claimed is:

1. A display device, comprising:
   a display panel comprising:
     a pixel definition layer in which a plurality of emission openings are defined,
     each of the plurality of emission openings having a first major dimension extending in a first extending direction which is greater than an emission opening dimension extending in a second extending direction which is orthogonal to the first extending direction, and
     a plurality of light emitting elements respectively corresponding to the plurality of emission openings; and
   in order from the display panel:
     a first insulating layer having a first refractive index and in which a plurality of openings are defined respectively corresponding to the plurality of emission openings in the pixel definition layer, each of the plurality of openings having a second major dimension extending in the second extending direction which is greater than an opening dimension extending in the first extending direction; and
     a second insulating layer having a second refractive index.

2. The display device of claim 1, wherein the plurality of openings in the first insulating layer comprise:
   a first opening having the second extending direction which extends in a first direction; and
   a second opening having the second extending direction which extends in a second direction intersecting the first direction.

3. The display device of claim 2, wherein within the first insulating layer:
   the first opening and the second opening are each provided in plural, and
   the plurality of first openings and the plurality of second openings are alternately arranged in a third direction which intersects each of the first direction and the second direction.

4. The display device of claim 2, wherein
   the plurality of openings in the first insulating layer comprise first, second, and third opening groups each of which includes the first opening and the second opening, and among the plurality of light emitting elements of the display panel:
light emitting elements corresponding to openings of the first opening group emit a same colored light,
light emitting elements corresponding to openings of the second opening group emit a same colored light, and
light emitting elements corresponding to openings of the third opening group emit a same colored light.

5. The display device of claim 4, wherein among the plurality of openings in the first insulating layer:
the openings of the first opening group are arranged along the first direction,
the openings of the second opening group are arranged along the first direction, and
the openings of the third opening group are arranged along a third direction which intersects each of the first direction and the second direction.

6. The display device of claim 4, wherein among the plurality of openings in the first insulating layer:
the first opening of the third opening group is between openings of the first opening group, and
the second opening of the third opening group is between openings of the second opening group.

7. The display device of claim 4, wherein among the plurality of light emitting elements of the display panel, a color of light emitted from light emitting elements which correspond to openings of the first opening group is different from a color of light emitted from light emitting elements which correspond to openings of the second opening group.

8. The display device of claim 7, wherein
among the plurality of light emitting elements of the display panel, a color of light emitted from light emitting elements which correspond to openings of the third opening group is:
different from the color of light emitted from the light emitting elements which correspond to the openings of the first opening group, and
different from the color of light emitted from the light emitting elements which correspond to the openings of the second opening group, and
wherein the color of light among the light emitting elements which correspond to the openings of the first, second and third opening groups, is one of red, blue, and green.

9. The display device of claim 4, wherein among the plurality of openings in the first insulating layer:
each of the openings of the first opening group and each of the openings of the second opening group has a planar area, and
the planar area of the openings of the first opening group are different from the planar area of the openings of the second opening group.

10. The display device of claim 4, wherein among the plurality of openings in the first insulating layer:
each of the openings of the first opening group, each of the openings of the second opening group and each of the openings of the third opening group has a planar area, and
the planar area of the openings of the third opening group is less than the planar area of the openings of the first opening group and less than the planar area of the openings of the second opening group.

11. The display device of claim 4, wherein among the plurality of openings in the first insulating layer:
each of the first, second, and third opening groups is provided in plural,
the first openings of the first opening groups and the first openings of the second opening groups are alternately arranged along a third direction which intersects the first direction and the second direction, and
the first openings of the third opening groups and the second openings of the third opening groups are alternately arranged along the third direction.

12. The display device of claim 1, wherein
each of the plurality of emission openings in the pixel definition layer comprises a first side which extends along the first extending direction,
each of the plurality of openings in the first insulating layer comprises a second side which extends along the first extending direction, and
a minimum interval between the first side and the second side is equal to or less than about 2 micrometers.

13. The display device of claim 1, further comprising an input sensing layer between the display panel and the first insulating layer,
wherein
the input sensing layer comprises in order from the display panel:
a first conductive layer;
a touch insulating layer; and
a second conductive layer, and
the first conductive layer and the second conductive layer of the input sensing layer do not overlap the plurality of openings in the first insulating layer.

14. The display device of claim 13, wherein the first insulating layer faces the second conductive layer of the input sensing layer.

15. The display device of claim 1, wherein
the first refractive index of the first insulating layer is in a range of about 1.3 to about 1.6, and
the second refractive index of the second insulating layer is in a range of about 1.6 to about 1.9.

16. The display device of claim 1, wherein the pixel definition layer comprises a black pigment or a black dye.

17. A display device, comprising:
a plurality of light emission regions comprising a plurality of red emission regions, a plurality of green emission regions and a plurality of blue emission regions;
a display panel comprising:
a pixel definition layer in which are defined a plurality of emission openings which correspond to the plurality of emission regions,
the plurality of emission openings comprising:
a plurality of red emission openings respectively corresponding to the plurality of red emission regions;
a plurality of blue emission openings respectively corresponding to the plurality of blue emission regions; and
a plurality of green emission openings respectively corresponding to the plurality of green emission regions, and
each of the red, blue, and green emission openings comprising:
a plurality of first emission openings extending in a first direction; and
a plurality of second emission openings extending in a second direction intersecting the first direction; and
an insulating layer on the display panel and in which are defined a plurality of openings respectively corresponding to the plurality of emission openings in the pixel definition layer, wherein the plurality of openings in the insulating layer comprise:
- a plurality of first openings corresponding to the first emission openings in the pixel definition layer and extending in the second direction; and
- a plurality of second openings corresponding to the second emission openings in the pixel definition layer and extending in the first direction.

18. The display device of claim 17, wherein a column direction and a row direction are orthogonal to each other and each intersect the first direction and the second direction, the red emission openings and the blue emission openings in the pixel definition layer are alternately arranged along the row direction and the column direction, and the green emission openings are arranged along the first and second directions, with the red emission openings in between.

19. The display device of claim 17, wherein the first emission openings of the red emission openings which have the first extending direction in the first direction and the second emission openings of the red emission openings which have the first extending direction in the second direction, are alternately arranged along the first direction, and the first emission openings of the blue emission openings which have the first extending direction in the first direction and the second emission openings of the blue emission openings which have the first extending direction in the second direction, are alternately arranged along the first direction.

20. The display device of claim 17, wherein the first emission openings of the green emission openings which extend in the first direction, and the red emission openings, are alternately arranged along the first direction, and the second emission openings of the green emission openings which extend in the second direction, and the red emission openings, are alternately arranged along the second direction.

21. An electronic device, comprising:

a display device which display an image; and the display device comprising:
- a pixel definition layer in which a plurality of emission openings are defined,
- each of the plurality of emission openings having a first major dimension extending in a first extending direction which is greater than an emission opening dimension extending in a second extending direction which is orthogonal to the first extending direction, and
- a plurality of light emitting elements respectively corresponding to the plurality of emission openings; and in order from the display device:
- a first insulating layer having a first refractive index and in which a plurality of openings are defined respectively corresponding to the plurality of emission openings in the pixel definition layer, each of the plurality of openings having a second major dimension extending in the second extending direction which is greater than an opening dimension extending in the first extending direction; and
- a second insulating layer having a second refractive index.

* * * * *